US009797974B2

(12) United States Patent
Cheng et al.

(10) Patent No.: US 9,797,974 B2
(45) Date of Patent: Oct. 24, 2017

(54) NONRIGID MOTION CORRECTION IN 3D USING AUTOFOCUSING WITH LOCALIZED LINEAR TRANSLATIONS

(71) Applicants: The Board of Trustees of the Leland Stanford Junior University, Palo Alto, CA (US); The Regents of the University of California, Oakland, CA (US)

(72) Inventors: Joseph Y. Cheng, Stanford, CA (US); John M. Pauly, Stanford, CA (US); Michael Lustig, Berkeley, CA (US); Shreyas S. Vasanawala, Stanford, CA (US)

(73) Assignees: The Board of Trustees of the Leland Stanford Junior University, Palo Alto, CA (US); The Regents of the University of California, Oakland, CA (US)

( * ) Notice: Subject to any disclaimer, the term of this patent is extended or adjusted under 35 U.S.C. 154(b) by 717 days.

(21) Appl. No.: 14/168,288

(22) Filed: Jan. 30, 2014

(65) Prior Publication Data
US 2014/0210469 A1  Jul. 31, 2014

Related U.S. Application Data

(60) Provisional application No. 61/758,448, filed on Jan. 30, 2013.

(51) Int. Cl.
*G01R 33/56* (2006.01)
*G01R 33/565* (2006.01)

(52) U.S. Cl.
CPC ............... *G01R 33/56509* (2013.01)

(58) Field of Classification Search
CPC .......... G01R 33/56509; G01R 33/5611; G01R 33/4822; G01R 33/5676; G01R 33/5673;
(Continued)

(56) References Cited

U.S. PATENT DOCUMENTS 6,307,369 B1 * 10/2001 Felmlee ............ G01R 33/56509
324/307
6,329,819 B1 12/2001 Manduca et al.
(Continued)

FOREIGN PATENT DOCUMENTS

EP  1148343  10/2001
EP  1164382  12/2001

OTHER PUBLICATIONS

Lin et al, Improved optimization strategies for autofocusing motion compensation in MRI via analysis of image metric maps, Mag. Res. Img.*

(Continued)

*Primary Examiner* — Clayton E Laballe
*Assistant Examiner* — Ruifeng Pu
(74) *Attorney, Agent, or Firm* — Beyer Law Group LLP

(57) ABSTRACT

A method for providing an magnetic resonance imaging (MRI) with nonrigid motion correction of an object is provided. An MRI excitation is applied to the object. A magnetic field read out from the object using a plurality of sensor coils. Spatially localized motion estimates are obtained for each sensor coil of the plurality of sensor coils. The motion estimates are used for each sensor coil to provide motion correction.

20 Claims, 12 Drawing Sheets

(58) Field of Classification Search
CPC ............ G01R 33/3415; G01R 33/4824; G01R 33/5616
See application file for complete search history.

(56) References Cited

U.S. PATENT DOCUMENTS

| | | | | |
|---|---|---|---|---|
| 6,647,134 | B1* | 11/2003 | McGee | G01R 33/56509 382/128 |
| 6,850,061 | B2 | 2/2005 | Stoyle | |
| 7,239,136 | B2 | 7/2007 | Sussman et al. | |
| 7,251,521 | B2 | 7/2007 | Seeber | |
| 7,692,423 | B2 | 4/2010 | Cunningham et al. | |
| 2002/0026115 | A1 | 2/2002 | Nehrke et al. | |
| 2003/0102864 | A1* | 6/2003 | Welch | G01R 33/56509 324/307 |
| 2008/0054899 | A1* | 3/2008 | Aksoy | G01R 33/5611 324/307 |
| 2009/0091321 | A1* | 4/2009 | Cunningham | G01R 33/5676 324/307 |
| 2011/0175609 | A1* | 7/2011 | Hu | G01R 33/3415 324/309 |
| 2012/0321162 | A1* | 12/2012 | Liu | G01R 33/443 382/131 |
| 2015/0302616 | A1* | 10/2015 | Haung | G01R 33/56509 382/131 |
| 2015/0323637 | A1* | 11/2015 | Beck | G01R 33/4828 600/410 |
| 2016/0003928 | A1* | 1/2016 | Chen | G01R 33/5611 324/309 |
| 2016/0202339 | A1* | 7/2016 | Zhang | G01R 33/56509 324/309 |

OTHER PUBLICATIONS

D. Atkinson, Motion Compensation Strategies, ISMRM 2011 Montreal.*
Lustig et al, Butterfly: A Self Navigating Cartesian Trajectory, Proc. Intl. Soc. Mag. Reson. Med.*
Cheng et al, Non-Rigid Motion Correction 3D Using Autofocusing with Localizing Linear Translations, Mag. Res. Med.*

* cited by examiner

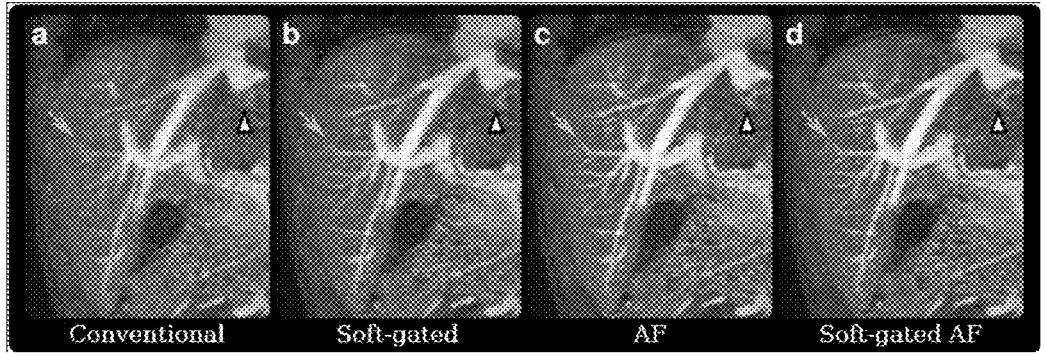

FIG. 9

Table 1. Iterative Gauss-Newton algorithm used to estimate motion for the one-dimensional Butterfly navigator in the $x$ direction.

| | Weighted Gauss-Newton Motion Estimate | |
|---|---|---|
| Goal: | $\min_{d_x, c_\phi} \sum_l w^2[l] \|s_0[l] - s[l]e^{-i2\pi k_x[l]d_x + c_\phi}\|^2$ | |
| Inputs: | $k_x[l]$ – $x$ navigator trajectory of length $L$ | |
| | $s_0[l]$ – reference signal evaluated at $k_x[l]$ | |
| | $s[l]$ – navigator signal evaluated at $k_x[l]$ | |
| | $w[l]$ – weights | |
| | $c_1$ – stopping criteria 1 | |
| | $c_2$ – stopping criteria 2 | |
| Outputs: | $c_\phi$ – bulk phase difference | |
| | $d_x$ – motion estimate as linear translation | |
| Algorithm: | $c_\phi = 0$, $d_x = 0$, $s_j[l] = s[l]$ | Initialization |
| | do{ | |
| | Construct r: $r[l] = w[l] \times (s_0[l] - s_j[l])$ | Weighted residual |
| | Construct $a_1$: $a_1[l] = w[l] \times i2\pi k_x[l]s_j[l]$ | $\approx \frac{d}{dd_x}r$ |
| | Construct $a_2$: $a_2[l] = w[l] \times i2\pi s_j[l]$ | $\approx \frac{d}{dc_\phi}r$ |
| | Solve: $\begin{bmatrix} \vdots \\ r \\ \vdots \end{bmatrix} = \begin{bmatrix} \vdots & \vdots \\ a_1 & a_2 \\ \vdots & \vdots \end{bmatrix} \begin{bmatrix} d_j \\ c_j \end{bmatrix}$ | Using weighted least-squares |
| | $d_x = d_x + d_j$, $c_\phi = c_\phi + c_j$ | Update |
| | $s_j[l] = s[l]e^{-i2\pi k_x[l]d_x + c_\phi}$ | |
| | }while $|d_j| > c_1$ and $|c_j| > c_2$ | |

TABLE 1

NONRIGID MOTION CORRECTION IN 3D USING AUTOFOCUSING WITH LOCALIZED LINEAR TRANSLATIONS

CROSS REFERENCE TO RELATED APPLICATIONS

This application claims priority under 35 U.S.C. §119(e) from U.S. Provisional Application No. 61/758,448, entitled "NONRIGID MOTION CORRECTION THROUGH AUTOFOCUSING", filed Jan. 30, 2013, and naming Cheng et al. as inventors, which is incorporated by reference in its entirety for all purposes.

GOVERNMENT RIGHTS

This invention was made with Government support under contract EB009690 awarded by the National Institutes of Health. The Government has certain rights in this invention.

BACKGROUND OF THE INVENTION

This invention relates generally to magnetic resonance imaging (MRI).

Magnetic resonance imaging (MRI) is a non-destructive method for the analysis of materials, and provides medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

MRI is based on nuclear spins, which can be viewed as vectors in a three-dimensional space. During an MRI process, each nuclear spin responds to four different effects: precession about the main magnetic field, nutation about an axis perpendicular to the main field, and both transverse and longitudinal relaxation. In steady-state MRI processes, a combination of these effects occurs periodically.

Compared with other modalities, such as X-ray, CT and ultrasound, MRI takes longer time, sometimes several minutes, for data acquisition to generate clinically useful images. Undesirable imaging artifacts may appear due to the long scan time. MRI using multiple receiving coils (phased array) has been introduced to shorten the scan time and increase signal to noise ratio (SNR). This fast imaging technique, known as parallel imaging (PI), can significantly accelerate data acquisition, and therefore reduce imaging artifacts and improve image quality.

Motion is a major source of artifacts for Magnetic Resonance (MR) studies. A typical sequence prescribed on the scanner takes anywhere from a couple seconds to a number of minutes. As a result, the scan is sensitive to motion. Motion can come from any number of sources including respiration, cardiac motion, blood flow, and even unintentional patient movement. The effects have been long studied and have been typically observed as ghosting, intensity changes, and blurring.

SUMMARY OF THE INVENTION

In accordance with the invention, a method for providing an magnetic resonance imaging (MRI) with nonrigid motion correction of an object is provided. An MRI excitation is applied to the object. A magnetic field read out from the object using a plurality of sensor coils. Spatially localized motion estimates are obtained for each sensor coil of the plurality of sensor coils. The motion estimates are used for each sensor coil to provide motion correction.

In another manifestation of the invention, a method for providing an magnetic resonance imaging (MRI) with non-rigid motion correction of an object is provided. An MRI excitation is applied to the object. A magnetic field is read out from the object using a plurality of sensor coils, wherein the sensor coils are spaced apart so that different sensor coils sense different 3D motion, wherein the reading out the magnetic field uses an acquisition trajectory with navigators. Spatially localized motion estimates are obtained for each sensor coil of the plurality of sensor coils. The motion estimates are used for each sensor coil to provide motion correction. An image is generated with nonrigid motion correction through 3D auto focusing.

The invention and objects and features thereof will be more readily apparent from the following detailed description and appended claims when taken with the drawings.

BRIEF DESCRIPTION OF THE DRAWINGS

FIG. 9a-d shows results of a free-breathing abdominal study of a 6-year-old patient scanned using a three-dimensional SPGR sequence with VDRad.

DETAILED DESCRIPTION OF ILLUSTRATED EMBODIMENTS

Figure 1:
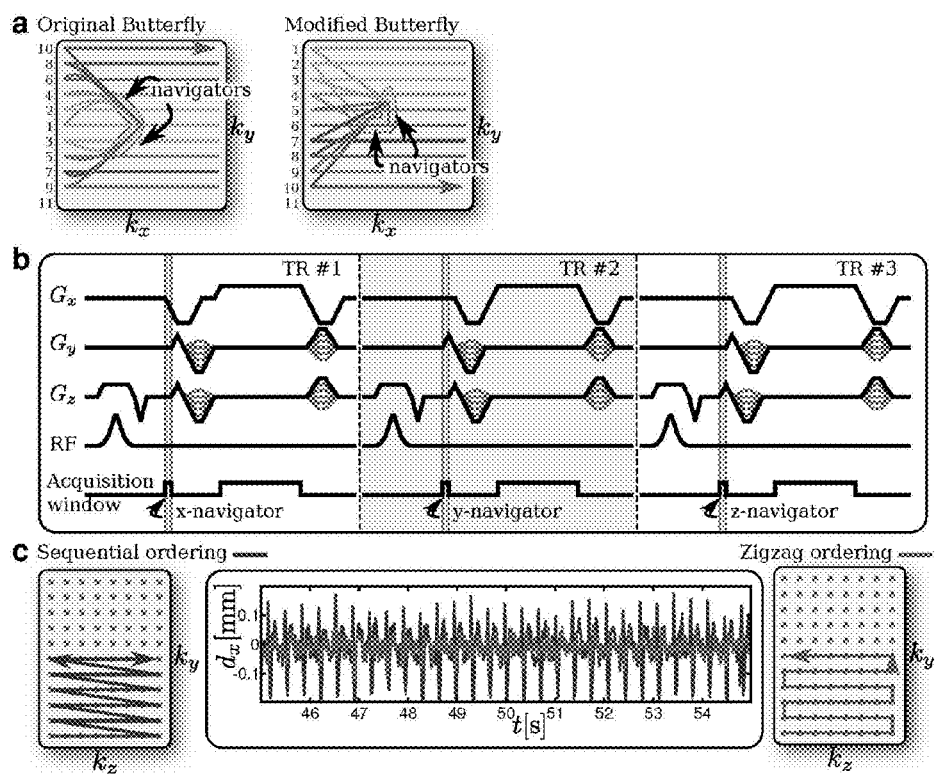
FIG. 1a-c are graphs related to Butterfly trajectories.

Motion artifacts can be reduced significantly with breath-held scans. However, this can be difficult to implement in practice, especially when imaging pediatric patients or when scan time is greater than 20-30 seconds. Costly sedation or anesthesia procedures are required for pediatric patients who are unable to achieve a sufficiently long breath-hold. Data acquisition can also be gated using measurements from respiratory bellows or electrocardiography. With these methods, scan duration is increased and the data is still sensitive to bulk motion. Countless motion prevention and correction techniques have been developed. These algorithms are applied during the scan or in the reconstruction. For more flexibility, embodiments focus on free-breathing studies and on suppressing motion retrospectively in the reconstruction.

In order to correct for non-rigid motion, an accurate motion model must be used. Bulk translational and rotational motion estimation are sufficient for rigid-body scans, but they do not capture the complexity of more general motion. A generalized matrix model has been demonstrated to be effective in parallel reconstruction for non-rigid motion correction. Additionally, a sophisticated model can be derived using image registration. These models are quite accurate; however, the complexity of these models also increases the complexity of the algorithms. Embodiments of the invention use a simple model: given a sufficiently small region of interest, non-rigid motion can be approximated by localized linear translations.

For this model to be effective, accurate motion measurements must be obtained. Many techniques have been developed to acquire this information. These techniques include using external monitors and using navigator data acquisitions. The navigator data can be obtained as a separate acquisition. It can also be built into the k-space trajectory. Motion information can also be extracted directly from the data or from the DC signal. An application of Cartesian imaging in an embodiment of the invention implements a technique based on the so-called "Butterfly" sequence. Butterfly is a modification of the spin-warp sequence in which the pre-winder gradients for phase-encodes are modified slightly to traverse the same trajectory at the beginning of each data acquisition. This makes it possible to obtain translational motion estimates with high temporal-resolution. The advantage of Butterfly is that it has negligible overhead for the imaging sequence and is particularly attractive for fast gradient-echo sequences. Navigator data can be improved using redundant data from a multi-channel coil array to help extract more accurate information. Such a Butterfly sequenced is described in U.S. Pat. No. 7,692,423, entitled SELF NAVIGATING CARTESIAN TREJECTORY, to Cunningham et al., and issued on Apr. 6, 2010, which is incorporated by reference for all purposes.

Measuring local motion using a coil array is not sufficient for correction using simple translations, because data from each coil still exhibit a degree of affine motion. Therefore, an embodiment of the invention uses localized autofocusing—the suppression of motion artifacts through the minimization of a metric. Because of the countless possible motion paths, autofocusing techniques have been previously limited to global rigid-body motion. With a dense enough receiving coil array, the motion measurements provide a good basis of possible motion exhibited by each image voxel. This limits the search space tremendously. Using the model of simple localized translations, a spatially-dependent autofocusing scheme is implemented to suppress non-rigid motion artifacts.

Methods

Localized autofocusing in MR applications has had some success in the area of off-resonance correction. An embodiment of the invention provides a similar approach to motion effects. By incorporating a localized motion-artifact metric, non-rigid motion can be approximated and corrected using local image translations. A key problem in making this clinically possible is that the search space for all possible motion paths is vast and the computational load can quickly become impractical. Therefore, an embodiment of the invention provides a feasible solution.

Navigator Data Acquisition

In order to obtain the M different motion paths, a variant of the Butterfly trajectory is implemented for Cartesian imaging. In general, the Butterfly trajectory acquires navigator data during the pre-winders (and optionally, the re-winders). This feature only requires a negligible time penalty; this approach can be generalized to any sequence that uses pre-winders. It is especially useful for fast acquisitions such as real-time imaging, fast steady-state gradient-echo imaging, and fMRI studies. By using this trajectory, navigator data can be obtained for each coil without significant effects on the sequence used. Additionally, there is no need to make sure the measurements are aligned properly with the acquired data—a concern when using external monitors.

In a traditional spin-warp sequence, the pre-winder phase-encode gradients are scaled such that a new k-space line is acquired for every repetition time (TR). In the original Butterfly trajectory, these phase-encode gradients are modified slightly such that in the beginning of the pre-winder, the same gradient is applied for every TR. The rest of the pre-winder is designed to achieve the total gradient area necessary to acquire each k-space line. This modification allows the traversal through k-space along the same diagonal trajectory for every TR. Data collected during that time can serve as navigation information. FIG. 1a illustrates the trajectory of an original Butterfly trajectory on the left, where the phase-encode ordering is numbered on the left. Note that the resulting trajectory shape resembles a butterfly wing—hence its name. FIG. 1a also illustrates a modified Butterfly trajectory used in this embodiment, shown on the right. FIG. 1b illustrates a pulse sequence timing diagram for an example of three-dimensional Butterfly trajectory that is used in this embodiment. FIG. 1c illustrates a phase/slice encoding effect on the motion measurement sequential phase/slice encode ordering on the left, zigzag phase/slice encode ordering on the right, and resulting motion measurements $d_x$ for a motionless scan in the middle. For the modified Butterfly trajectory, this is just an example of a possible ordering. Other embodiments or examples may use other orderings.

The original Butterfly trajectory is very effective in estimating translational motion in two-dimensions. However, it has several limitations, which become more obvious for three-dimensional studies. The additional encoding direction increases the navigator's sensitivity to system error such as gradient delays and eddy-currents; the longer scan time increases the amount of error accrued. Also, there is not much flexibility in choosing the phase/slice encode ordering. For the two-dimensional case, the original trajectory acquires navigator data along the upper-left quadrant diagonal and along the lower-left quadrant diagonal in k-space. To interleave the acquisition of the two different diagonals, the acquisition must alternate between acquiring a k-space line in the upper quadrant and a k-space line in the lower quadrant.

To address these concerns, in an embodiment of the invention the Butterfly navigators are modified to acquire data along each axis. This modification gives us three main advantages. First, only one gradient-coil at a time is used for the navigator acquisition. This method increases robustness to certain system errors such as different timing delays among the imaging gradients. These timing delays result in simple shifts in the navigator acquisition. Second, the computational complexity for extracting the motion estimate is reduced. Lastly, there is added flexibility in the phase/slice encode ordering—making the method practical for applications that use special ordering such as elliptic centric ordering. This variant of the Butterfly trajectory costs an additional time penalty total of ~0.5 ms per TR for a navigator readout duration of 0.14 ms. An example of this modified Butterfly trajectory is shown in FIG. 1a. The pulse-sequence timing diagram is shown in FIG. 1b for a three-dimensional scan.

Other systematic errors such as eddy currents and gradient hysteresis still affect the stability of the navigator data. To reduce these effects, the phase/slice encodes for three-dimensional scans are ordered in a way that the distance traveled in k-space between each phase/slice encode is minimized. Then, the differences in gradient waveforms from TR to TR are minimized to reduce the change in eddy current and gradient hysteresis effects. This allows for better motion estimation when comparing two subsequent navigators. For simplicity, this embodiment used a zigzag ordering of the phase/slice encodes and noticed a reduction factor of ~2 in motion measurement fluctuations, as shown in FIG. 1c. As long as the distance between each encode is small, a more sophisticated phase/slice encode ordering can be implemented. Interestingly, the observed eddy currents are not due to the Butterfly navigators. When using fast RF-spoiled gradient echo sequences, we noticed that eddy currents from overlapping rewinders and crushers at the end of each TR affect the slab selection for the next TR. This effect is small and is not observed in the imaging. However, it does create phase variations that result in motion estimate fluctuations on the order of ±0.05 mm.

Motion Extraction from Navigator Data

Our assumption is that each coil element has very localized sensitivity. In this case, the motion observed for each coil image is approximated as a linear translation—a linear-phase shift in the frequency domain, $$s_n[l] = s_0[l] e^{i2\pi k[l] \cdot d[n]}. \qquad [1]$$

The navigator data are the first L samples of each readout, where index $l \in [0 \ldots L]$ enumerates the samples and corresponds to the time of acquisition (within a TR). Index n, on the other hand, corresponds to the TR number. For $n^{th}$ navigator signal $s_n[l]$, linear translation $d[n] = (d_x[n], d_y[n], d_z[n])$ is modeled as a linear-phase modulation applied to the reference navigator signal, $s_0[l]$. Three-element vector $k = (k_x, k_y, k_z)$ represents the k-space location. Signals $s_0[l]$ and $s_n[l]$ both correspond to k-space location $k[l]$. For generality, x, y, and z respectively represent the readout, phase-encode, and slice-encode axes. In Eq. [1], motion is assumed to only occur between each data acquisition. This is a reasonable model given a short readout.

When estimating d[n], care must be taken to ensure robustness against signal fluctuations. The modification to the Butterfly acquisition reduces some of the systematic errors. Precautions must also be taken during post-processing. These errors are unavoidable; for example, motion relative to each coil results in changes in the signal intensity. Additionally, $B_0$ eddy currents contribute to signal fluctuations. To account for observed errors, Eq. [1] was modified to include bulk magnitude and phase fluctuations. The magnitude and phase fluctuations are represented by a complex scaling factor $C[n] = c_r[n] e^{i2\pi c_\phi[n]}$:

$$s_n[l] = C[n] s_0[l] e^{i2\pi k[l] \cdot d[l]}. \qquad [2]$$

Many methods may be used to estimate d[n] in either the image domain or the frequency domain. Image-domain based algorithms require a transformation from the acquired k-space into the image space. Since the Butterfly navigators are acquired during the ramp of the pre-winder gradients, the data is acquired with linearly increasing spacings along a single-sided k-space spoke. This makes it difficult to perform an accurate non-uniform Fourier transform. A couple of fast frequency-domain based algorithms may also be used. Unfortunately, these schemes assume a uniform sampling pattern.

To account for C[n] while estimating d[n], we use an iterative Gauss-Newton method to find parameter values that best fit the nonlinear model in the least-squares sense. The parameter values are calculated by first estimating the magnitude-based parameters. Afterward, the phase-based parameters are estimated. More specifically, the magnitude of C[n], $c_r[n]$, is first estimated using least-squares:

$$\min_{c_r[n]} \Sigma_l (c_r[n] |s_0[l]| - |s_n[l]|)^2 [ \qquad [3]$$

The reference signal is updated to $s_0'[l] = c_r[n] s_0[l]$. Then, $c_\phi[n]$ and d[n] are estimated with another optimization problem:

$$\min_{(d[n], c_\phi)} \Sigma_l |s_n[l] - s_0'[l] e^{i2\pi(k[l] \cdot d[n] + c_\phi[n])}|^2. \qquad [4]$$

The Butterfly navigator samples k-space more densely near the origin where the signal is the highest. Also, for these data points, the eddy current effects are stronger, because they are closer in time to the beginning of the TR. Unfortunately, naive fitting through least-squares will put much weight on these potentially corrupted points. Weights incorporated into the algorithm (Eqs. [3] and [4]) counteract these effects:

$$\min_{c_r[n]} \Sigma_l w^2[l] (c_r[n] |s_0[l]| - |s_n[l]|)^2, \qquad [5]$$

$$\min_{(d[n], c_\phi)} \Sigma_l w^2[l] |s_n[l] - s_0'[l] e^{i2\pi(k[l] \cdot d[n] + c_\phi[n])}|^2. \qquad [6]$$

A summary of the weighted Gauss-Newton algorithm to solve Eq. [6] is shown in Table 1 for a one-dimensional Butterfly navigator in the x-direction. The same algorithm is used for the y and z navigators. Since the different navigators are interleaved, the motion measurement extracted is interpolated to estimate the full motion path, d[n]. This measurement can be filtered to remove any residual high-frequency signal fluctuations.

In an implementation, two different sets of weights are used and the fitting is performed twice. The first set of weights is designed to avoid phase-wrapping. The second is designed to achieve a more accurate estimate of d[n]. For the purpose of avoiding phase-wraps, first, Eqs. [5] and [6] are solved using magnitude-based weights. For example, $$w_1[l] = |s_0[l]|. \qquad [7]$$

The higher-magnitude data points are associated not only with higher signal but also with the data at the beginning of the navigator with smaller sampling spacing in k-space. Closer spacing helps avoid phase-wraps when estimating the linear phase. The weights in Eq. [7] are used to solve Eqs. [5] and [6] with a high error tolerance for a rough estimate. Afterward, the error tolerance is lowered when a second set of weights are used. These weights emphasize the less-corrupted data points with more motion information in the phase:

$$w_2[l] = |k[l]|.  \quad [8]$$

Both $w_1[l]$ and $w_2[l]$ are incorporated into a two-stage weighted Gauss-Newton algorithm to quickly solve for the motion estimate.

Sampling and View Ordering Scheme

The effectiveness of the embodiment depends on the image artifacts resulting from motion corruption. Further, the image artifacts depend on how the data were acquired. For a more effective correction, the data should be acquired in such a way to structure global image artifacts as incoherent. In this way, the autofocusing invention will not attempt to sharpen and enhance the image artifacts.

Many different acquisition schemes, both Cartesian and non-Cartesian methods, can be used for this purpose. As an example, we demonstrate the embodiment using a 3D Cartesian scheme called Variable-Density sampling and Radial view ordering (VDRad) as described in Cheng J Y, Zhang T, Alley M T, Lustig M, Vasanawala S S, Pauly J M. "Variable-density radial view-ordering and sampling for time-optimized 3D Cartesian imaging," in Proceedings of the ISMRM Workshop on Data Sampling and Image Reconstruction, Sedona, Ariz., USA, 2013.

In VDRad, the $(k_y, k_z)$-points, or views, are grouped into variable-density radial/spiral spokes. The spokes are pseudo-randomly ordered according to the golden angle scheme to achieve the most uniform distribution of motion-corrupted data throughout k-space. This provides flexibility in rejecting/accepting data without losing large contiguous portions of k-space.

Figure 2:
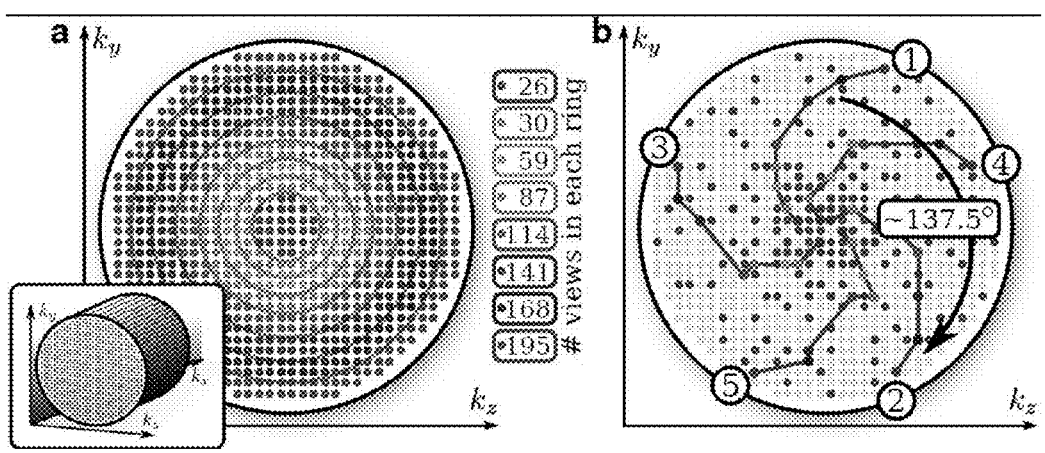
FIG. 2a-b illustrates the data acquisition process using VDRad.

FIG. 2a-b illustrate the data acquisition process using VDRad. In FIG. 2a, $(k_y, k_z)$-views are divided into concentric rings where each ring has a different number of samples. FIG. 2b shows the resulting sampling and view-ordering—views are shaded according to the corresponding ring; the dark points are sampled after the calibration region is sufficiently covered. Each spoke is acquired according to the golden-ratio angle; this ordering is illustrated by the number next to each spoke. This method is applied to 3D Cartesian imaging—sampling on a Cartesian grid in the $(k_y, k_z)$-plane and a full readout in the $k_x$ direction. Since rings closer to the center have fewer views, these are acquired more rapidly compared to the outer rings. This method generates the variable-density sampling.

Motion Correction

Figure 3A:
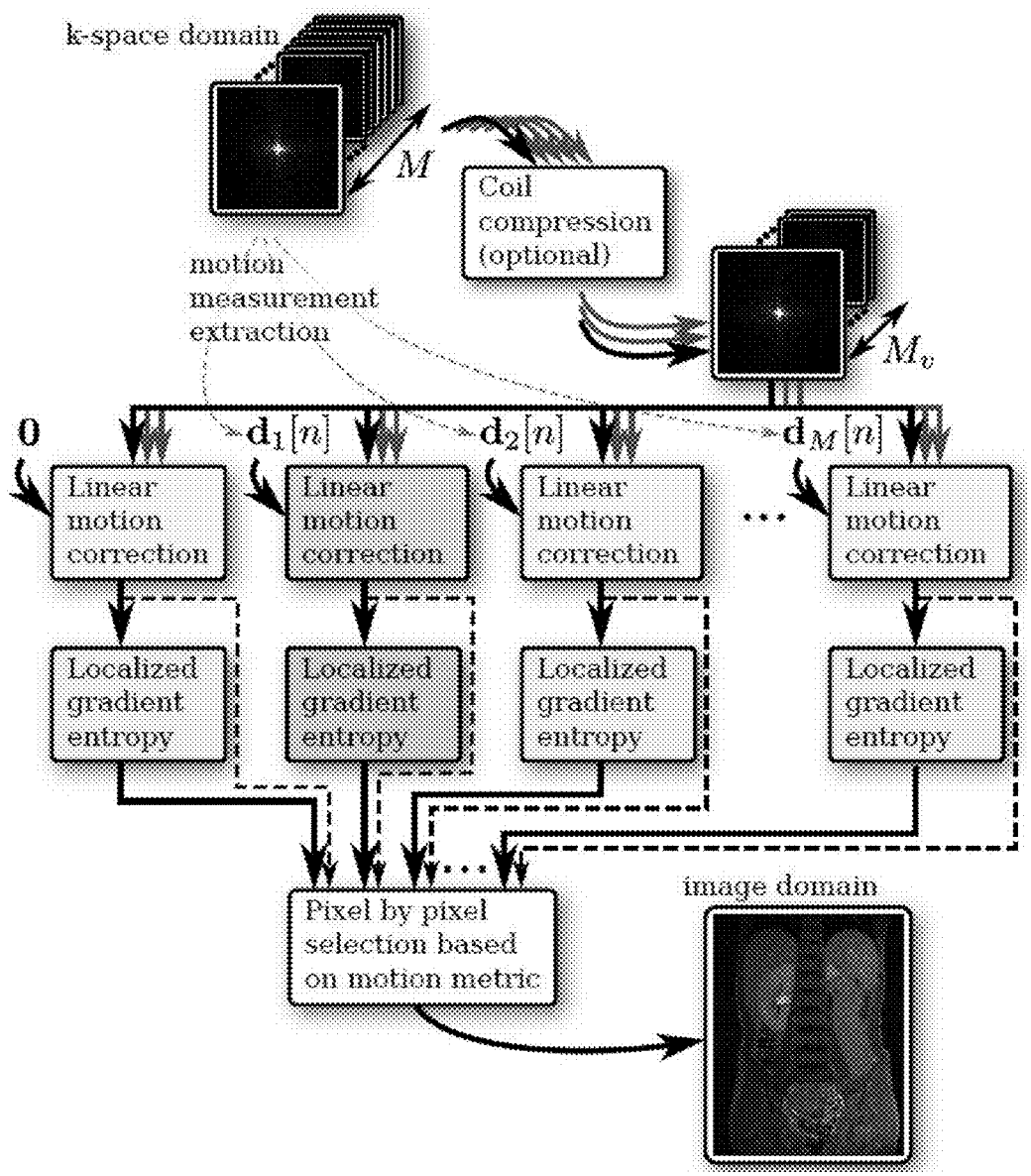
FIG. 3a-c illustrates processes used in a motion correction process.
Figure 3B:
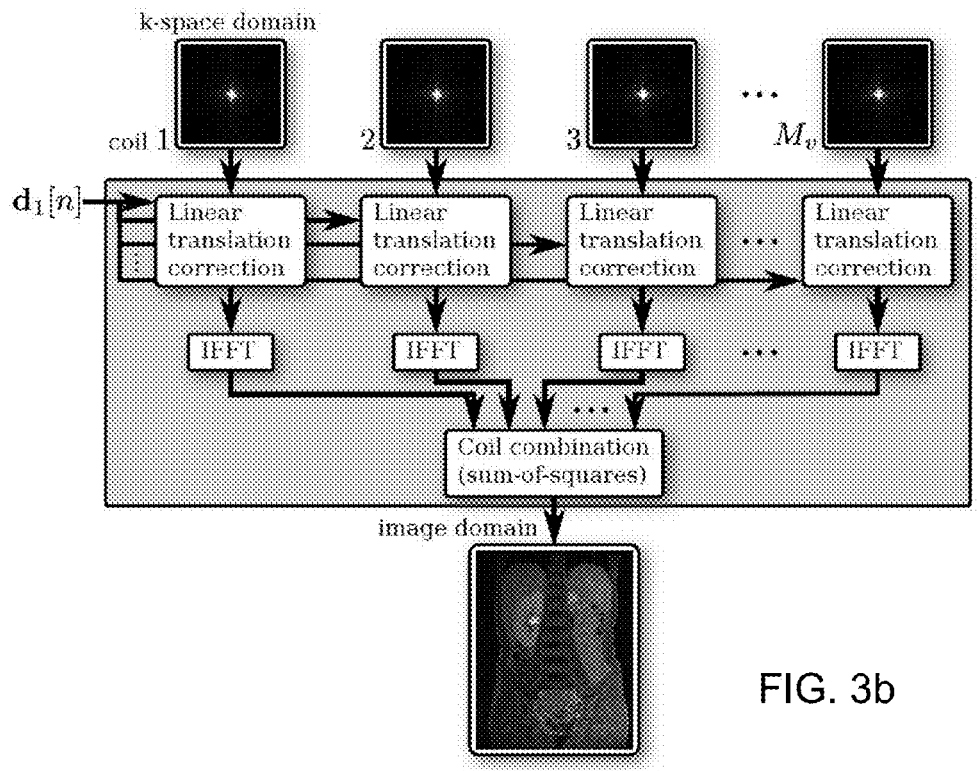

After data acquisition and motion extraction from M channels, this embodiment provides M motion estimates: $d_1[n], d_2[n], \ldots d_M[n]$. These measurements provide a good search space in finding the motion at each spatial position in the image for each TR. As a simplification, this embodiment approximates non-rigid motion as local linear translations rather than rotation, contraction/expansion, and other complicated transformations. Using this model, it is noted that particular image locations can be focused with a given motion path. Therefore, this embodiment applies linear-phase correction to all the acquired k-space data with each of the M motion measurements. After transforming to image space, this embodiment uses a motion-artifact metric to determine locally which measurement yielded the best linear correction, as shown in FIG. 3a.

Reduced Computation with an Optional Coil Compression

To reduce computation, it is possible to perform coil compression prior to the linear-phase correction. Coil compression algorithms combine data from multiple channels into fewer so-called "virtual coils". Coil compression is allowed as long as multi-channel data from the same phase/slice encode acquired at the same time are combined; they exhibit the same motion. This embodiment uses an improved algorithm based on an algorithm described in U.S. Pat. No. 8,538,115, entitled COIL COMPRESSION FOR THREE DIMENSIONAL AUTOCALIBRATING PARALLEL IMAGING WITH CARTESIAN SAMPLING, to Zhang et al., and issued on Sep. 17, 2013.

The compression is achieved by linearly combining the data from the different coils. Therefore, applying the compression weights followed by the linear motion correction of each virtual coil is equivalent to applying the compression weights after the linear motion correction of each original coil.

Rather than performing $M^2$ corrections (M motion paths on k-space data from M coils), the computation is reduced to $MM_v$ corrections (M motion paths on $M_v$ virtual coil data). By compressing data from 32 coils to 6 virtual coils, the computation is effectively reduced by a factor of ~5. Note that coil compression is not performed on the navigator data to maintain the localization from the physical coils.

Linear Correction

After correcting for different motion measurements, this embodiment determines which correction yielded the best result for a particular location. Linear translations are fast to correct because they manifest in k-space data as linear phase. For the n-th acquisition, the k-space data are corrected using the measured motion, $d[n]=(d_x[n], d_y[n], d_z[n])$ with the following equation.

$$s_n'[l] = s_n[l] e^{-i2\pi(k_x[l]d_x[n]+k_y[l]d_y[n]+k_z[l]d_z[n])} l \in \text{readout portion of the } TR  \quad [9]$$

The original n-th acquired k-space readout line is represented by $s_n[l]$. This line represents data acquired with a frequency encoding of $k_x[l]$, a phase encoding of $k_y[n]$, and a slice encoding of $k_z[n]$. Motion is assumed to only occur between each TR, but Eq. [9] can be easily extended to support motion during data acquisition.

The formulation in Eq. [9] is applied to each of the $M_v$ virtual coils using motion measurement $d_1[n]$. Afterward, an inverse Fourier transform is applied to the modified k-space data. The resulting images are combined using any preferred coil-combination algorithms. Sum-of-squares is used here for simplicity. A block diagram summarizing this step is shown in FIG. 2b. This linear correction step is performed for each of the M motion estimates.

In providing a non-rigid motion correction overview. FIG. 2a illustrates a correction scheme using data from an M-channel coil array. FIG. 2b illustrates a linear translational motion correction using motion measurement $d_1[n]$. FIG. 2c illustrates a localized gradient entropy calculation, which will be described in Eq. 12, below.

Localized Motion Metric

After correcting for different motion measurements, the embodiment determines which correction yielded the best result for a particular location. For an objective evaluation, a localized motion-artifact metric is used. This criterion is minimized for piece-wise smooth images which have been found to be a good model for normal MR scans. In previous literature, this gradient entropy metric H have been globally applied:

$$H = \sum_{ijk} p_{ijk} \log_2 [p_{ijk}]  \quad [10a]$$

$$p_{ijk} = \frac{h_{ijk}}{\sum_{ijk} h_{ijk}} \quad [10b]$$

$$h_{ijk} = \sqrt{|\nabla_i I_{ijk}|^2 + |\nabla_j I_{ijk}|^2 + |\nabla_k I_{ijk}|^2} \quad [10c]$$

The complex pixel value of image I at index (i,j,k) is denoted as $I_{ijk}$. To make the criterion independent of the scan orientation, total absolute gradient is computed. The value of $\nabla_i I_{ijk}$, $\nabla_j I_{ijk}$, and $\nabla_k I_{ijk}$ can be approximated as one-dimensional differences: $I_{i+1,jk}-I_{ijk}$, $I_{ij+1,k}-I_{ijk}$, and $I_{i,j,k+1}-I_{ijk}$ respectively.

This embodiment modified the gradient entropy metric to be a localized metric by calculating Eq. [10] for a selected area around the pixel of interest.

$$H_{ijk} = -\sum_{uvw}{}^b p_{uvw} \log_2[p_{uvw}] \quad [11a]$$

$$b=(b_i,b_j,b_k)=\text{summation window width} \quad [11b]$$

For convenience, the three-dimensional summation operator $$\sum_{u=i-\frac{b_i}{2}}^{i+\frac{b_i}{2}} \sum_{v=j-\frac{b_j}{2}}^{j+\frac{b_j}{2}} \sum_{w=k-\frac{b_k}{2}}^{k+\frac{b_k}{2}}$$

is represented as $\sum_{uvw}{}^b$. Equation [11] can be re-written in terms of h of Eq. [10c] as $$H_{ijk}=\log_2[\sum_{uvw}{}^b h_{uvw}]-(\sum_{uvw}{}^b h_{uvw})^{-1}[\sum_{uvw}{}^b h_{uvw} \log_2(h_{uvw})] \quad [12]$$

Figure 3C:
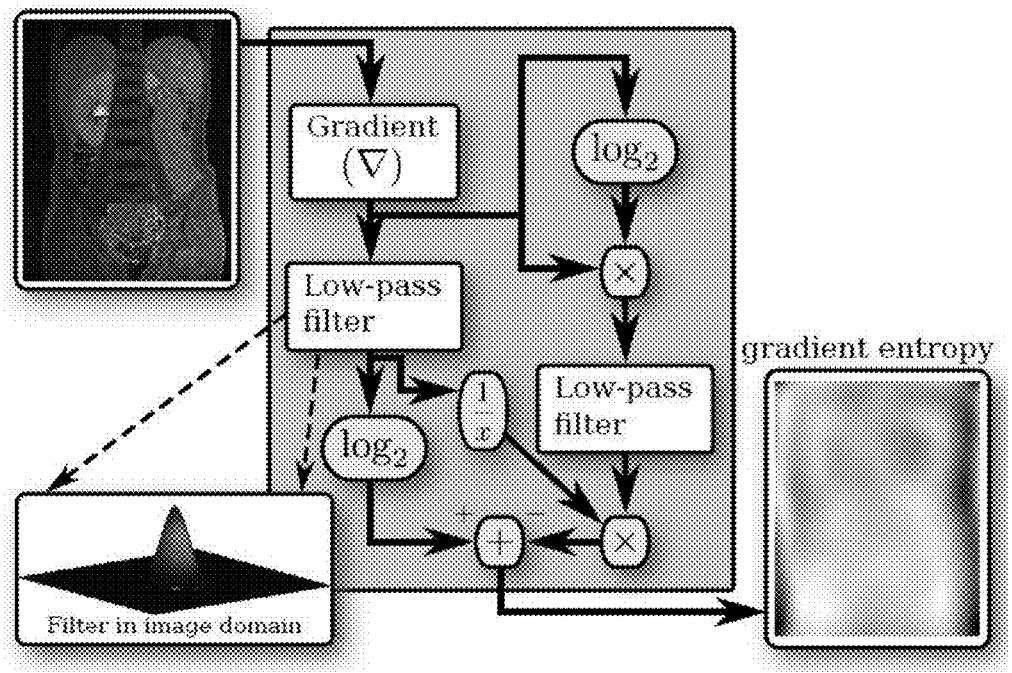

Performing the summation operator in Eq. [12] is equivalent to filtering with a moving-average filter. To make the entropy measure more localized to the center of the window, we use a low-pass Hanning filter. This embodiment implements a three-dimensional separable Hanning window with a main-lobe width of b. A block diagram of the local gradient entropy calculation is shown in FIG. 3c.

The value of window-width b influences the resulting correction. Fine motion details are captured by smaller values of b. However, b must be sufficiently large to capture anatomical structure; otherwise, motion artifacts are mistakenly amplified. An isotropic window width is used.

$$b_c=\delta_i b_i=\delta_j b_j=\delta_k b_k \quad [13]$$

Figure 4:
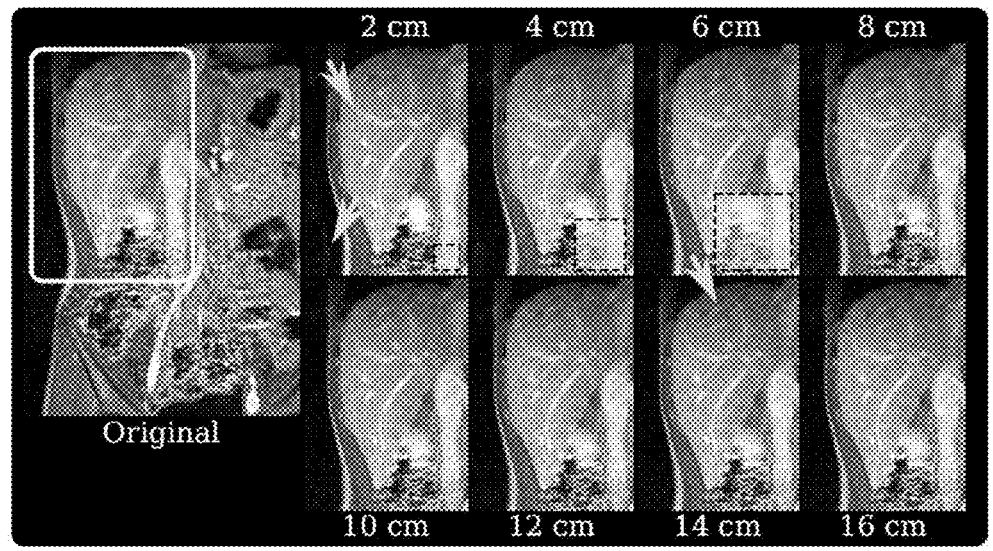
FIG. 4 shows the result of applying different filtering widths.

Variables $\delta_i$, $\delta_j$, $\delta_k$ represent the image-pixel resolution. FIG. 4 shows the result of applying different filtering widths $b_c$ for the localized gradient entropy calculations. The window widths $b_c$=2 cm, 4 cm, and 6 cm are shown for scale. When $b_c$=2 cm, the arteries appear sharper; however, the ghosting artifact from the fat wall is introduced. Additionally, noise amplification can be noticed outside the body. With $b_c$=14 cm, the arteries blur and a faint ghosting artifact appears above the liver; this region cannot be successfully approximated as linear translations. For a nice balance, $b_c$=10 cm is used for our corrections. This corresponds to a full width at half maximum of 5 cm. In all cases, the result is an improvement over the original uncorrected image. For a favorable balance between correction and amplification of artifacts, $b_c$=10 cm is used. This corresponds to a full width at half maximum of 5 cm.

With an appropriate motion metric, we can use autofocusing to locally determine which motion measurement yielded the best result for a select region. With an appropriate motion metric, we can use autofocusing to locally determine which motion measurement yielded the best result for a select region.

$$m_{ijk}=\arg\min_m H_{ijk}[m] \quad [14a]$$

$$\tilde{I}_{ijk}=I_{ijk}'[m_{ijk}] \quad [14b]$$

The motion estimate number is m. The image corrected using motion measurement $d_m[n]$ is denoted by I'[m]. The gradient entropy at pixel (i,j,k) for image I'[m] is represented as $H_{ijk}[m]$. Image $\tilde{I}$ is the final corrected image. In Eq. [14a], for every voxel in the image, we chose which motion correction (out of the M possible ones) best minimizes the metric. In Eq. [14b], we chose the voxel value corresponding to that correction as the solution.

Soft-Gated Accelerated Imaging

The accuracy of the embodiment can be improved by including advance accelerated imaging techniques. For example, soft-gating can be included to reduce the severity of the motion corruption. Additionally, subsampling the required data and reconstructing the images through parallel imaging and/or compressed sensing can shorten the scan duration. This reduces the time duration that the patient must remain stationary.

Typically, the images can be reconstructed from the subsampled acquisition by solving the following optimization problem $$\arg\min_m \|D\mathcal{F}Sm-y\|_2^2+\lambda\|\Psi m\|_1. \quad [15]$$

The first term minimizes the difference between the acquired data y and the reconstructed image m through the acquisition model. This model consists of multiplying m by coil sensitivity maps S, transforming the data into k-space with the Fourier transform operator $\mathcal{F}$, and selecting the acquired data points using matrix D. The second term is multiplied by regularization parameter $\lambda$. This term favors solutions that are sparse in a sparsifying transform domain using the transform operator $\Psi$. For our purpose, we use the Wavelet transform as the sparsifying transform.

Many different solvers have been developed to solve the nonlinear problem in Eq. [15]. The approach that we take is L1-ESPIRiT—an eigenvalue approach to autocalibrating parallel MRI with an L1 penalty for compressed sensing as described by Uecker M, Lai P, Murphy M J, Virtue P, Elad M, Pauly J M, Vasanawala S S, Lustig M. "ESPIRiT—an eigenvalue approach to autocalibrating parallel MRI: Where SENSE meets GRAPPA," Magnetic Resonance in Medicine, doi: 10.1002/mrm.24751.

The formulation finds an image m that best fits the constructed model assuming that all data equally describes it. However, when a patient moves during the scan, each data point will be affected by a different degree of motion corruption. Additionally, patient movement may cause changes to field inhomogeneity or even variations in sensitivity maps that further corrupt the data. Thus, a more robust reconstruction is achieved by weighting the data or, in the case of free-breathing abdominal imaging, "soft-gating" the acquisition to nonrigid respiratory motion. This operation is implemented with data-consistency weights that are represented by the diagonal matrix W. Using these weights, Eq. [15] can be rewritten as $$\arg\min_m \|W(D\mathcal{F}Sm-y)\|_2^2-\lambda\|\Psi m\|_1 \quad [16]$$

For matrix W, weights closer to one mean that the corresponding data are assumed to be motion-free, and therefore, the measurements should be trusted. Weights closer to zero mean that the corresponding data are corrupted, and therefore, the data consistency should incur very little penalty on the objective function. We modify the original L1-ESPIRiT algorithm to incorporate these weights as soft-gated L1-ESPIRiT, or L1-wESPIRiT.

Given a set of motion estimates from an array of coil receivers, there are a variety of methods to calculate elements in W. One simple approach is to combine the motion estimates, and to calculate a single weight w[n] that can be applied to all data from the n-th TR as $$\bar{d} = \left( \frac{1}{M} \sum_{i=0}^{M-1} \|d_i[n]\| \right)^{\frac{1}{2}}, \quad [17]$$

$$w[n] = \begin{cases} e^{-c_\alpha \{\bar{d}[n] - (c_{th} + c_k k_r^2[n])\}} & \text{if } \bar{d}[n] > c_{th} + c_k k_r^2[n] \\ 1 & \text{otherwise.} \end{cases} \quad [18]$$

Each motion path $d_i[n]=(d_x[n],d_y[n],d_z[n])$ measures three-dimensional translational motion from a spatially-localized receiver element in an M-channel coil array. The M motion estimates from the different channels can be combined into $\bar{d}[n]$ using root mean square. The threshold is set by $c_{th}$. Motion less than $c_{th}$ is assumed to be free from motion-corruption; motion greater than this value is exponentially weighted down. An additional term $c_k k_r^2[n]$ can adjust the threshold for each readout according to its artifact power, which is roughly proportional to the square of the distance from the center of k-space as $k_r^2[n]=k_y^2+k_z^2[n]$.

Figure 5:
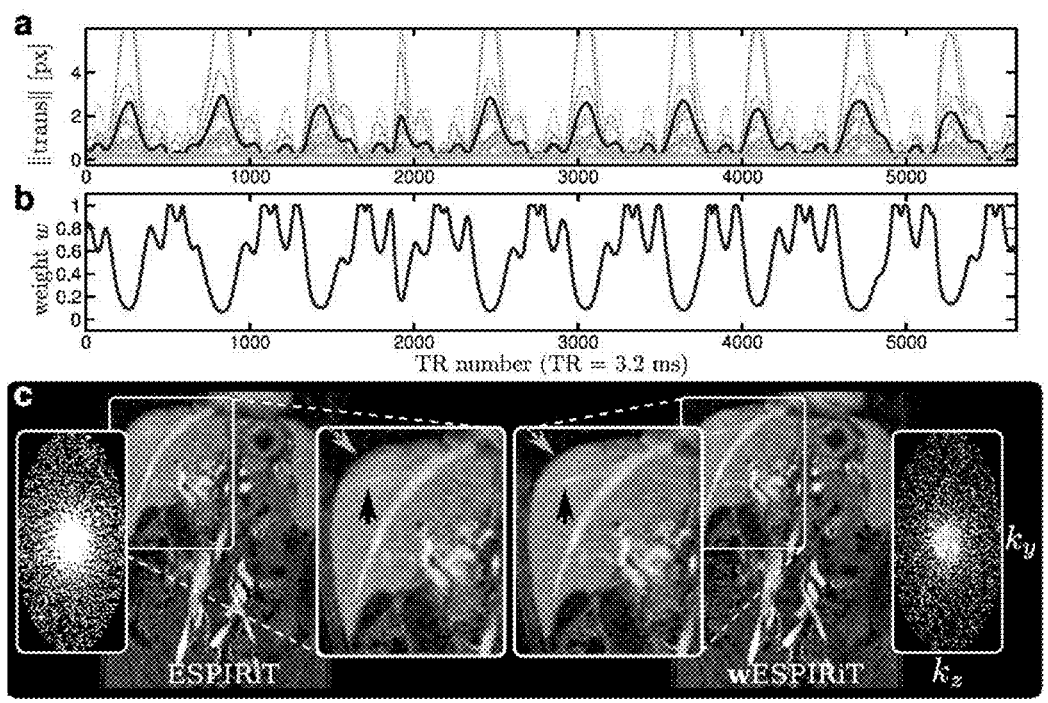
FIG. 5a graphs the motion measured from the different coil receivers.
FIG. 5b illustrates the soft-gating weights computed from the motion measurements.
FIG. 5c illustrates the image quality improvement from using soft-gating over conventional accelerated imaging reconstruction techniques.

The soft-gating reconstruction is demonstrated in FIG. 5a-c. FIG. 5a graphs the magnitude translations where each color represents a measurement from a different channel in a coil array. The dark line corresponds to the root mean square of all measurements, and the solid lighter shading denotes the threshold at 0.25 pixels (px). FIG. 5b shows the computed weights w from the root-mean—square motion measurement. FIG. 5c compares the image reconstructed using no weights (conventional ESPIRiT) and image reconstructed using weights (wESPIRiT). The sampling mask and the weighted sampling mask are displayed adjacent to the reconstructed images. By incorporating motion-based weights into the parallel imaging reconstruction, the data acquisition is soft-gated and an improvement to the image quality can be appreciated: the liver dome is sharpened (lighter shaded dashes arrow) and a branch hepatic vein is recovered (black arrow). In this figure, $c_{th}=0.25$ pixels, $c_\alpha=1$, and $c_k=0$ with values of $k_r[n]$ in terms of pixels$^{-1}$. For our studies, we experimentally determined acceptable values for the parameters: $c_{th}=0.25$ pixels, $c_\alpha=1$, and $c_k=4$.

The original autofocusing scheme is extended to incorporate the soft-gated accelerated imaging. For each possible motion path $d_i[n]$, a simple linear-translation correction is applied to all the channels of k-space data. Next, the soft-gated reconstruction is performed, which in our case is L1-wESPIRiT.

The total computation for the embodiment depends on the number of possible motion paths. Fortunately, the reconstruction of each $d_i[n]$, candidate can be performed on parallel computing systems. Still, if a particular algorithm has to be applied to each image in the bank before the final image is pieced together, the computation may increase drastically. If possible, it is more efficient to apply these reconstruction steps after the autofocusing algorithm is executed. In our setup, we apply partial k-space reconstruction (more specifically, Homodyne reconstruction) after the autofocusing algorithm. The effects are negligible if each autofocused image patch is smoothly varying both in phase and in magnitude to the adjacent image patch. If this constraint is violated, strange artifacts arise, such as image shearing. These artifacts can be reduced through soft-gated accelerating imaging, because the weighting minimizes the differences between each image patch in the final autofocused image.

Experiment

To test the algorithm, studies were performed on a General Electric MR750 3T scanner (Waukesha, Wis.). A number of phantom studies were conducted to validate the motion measurements from the Butterfly navigator acquisition using a single-channel quadrature head coil. The stability of the motion measurement was analyzed on a motionless phantom. The accuracy of the measurement was analyzed on a moving phantom. A simple linear translation correction was performed to test the quality of the observation. For this case, the scan table was programmed to move periodically in the superior/inferior direction to induce simple rigid motion.

Abdominal studies were conducted using a custom high-density phased array coil constructed at our institution in collaboration with GE Healthcare-32-channel pediatric torso receiver coil. When scanning the pediatric patients for the first two studies, a portion of the central k-space data was respiratory triggered and gated. This strategy provided accurate data to estimate a reference navigator for motion extraction and to calibrate weights for coil compression. Remaining data were acquired during free-breathing.

Additional studies were conducted where the VDRad scheme was incorporated into the data acquisition process. In these studies, the entire scan was acquired while the patient was freely-breathing.

For all experiments, the scan was performed in the coronal orientation using a three-dimensional spoiled gradient echo acquisition (SPGR) sequence using a flip angle of 15°. Specific scan parameters used for each study are summarized in Table 2. The reconstruction was performed on a Linux system with an Intel Core i7-950 3.07 GHz Quad-Core processor, 24 GB of RAM, and a NVIDIA GeForce GTX 470 graphics card. The algorithm was implemented using a combination of Matlab (MathWorks, Natick, Mass.) and C++/CUDA (NVIDIA, Santa Clara, Calif.).

TABLE 2

|  | Phantom Study | Study 1 | Study 3 | Study 4 |
| --- | --- | --- | --- | --- |
| TE/TR: | 3.5 ms/7.3 ms | 2.1 ms/5.5 ms | 1.3 ms/3.4 ms | 1.3 ms/3.2 ms |
| Resolution: | (0.9, 0.9, 1.0) mm | (0.9, 0.9, 3.0) mm | (1.0, 1.4, 2.0) mm | (0.9, 1.2, 2.4) mm |
| FOV: | (28.0, 22.4, 18.0) cm | (30.0, 24.0, 15.6) cm | (32.0, 24.0, 16.0) cm | (28.0, 22.4, 16.3) cm |
| Bandwidth: | 62.5 kHz | 62.5 kHz | 100 kHz | 100 kHz |
| Respiratory-gated k-space | 0% | 10% | 0% | 0% |
| Use VDRad | No | No | Yes | Yes |
| Coil | 1-ch head | 32-ch ped torso | 32-ch cardiac | 32-ch cardiac |

Results

Figure 6:
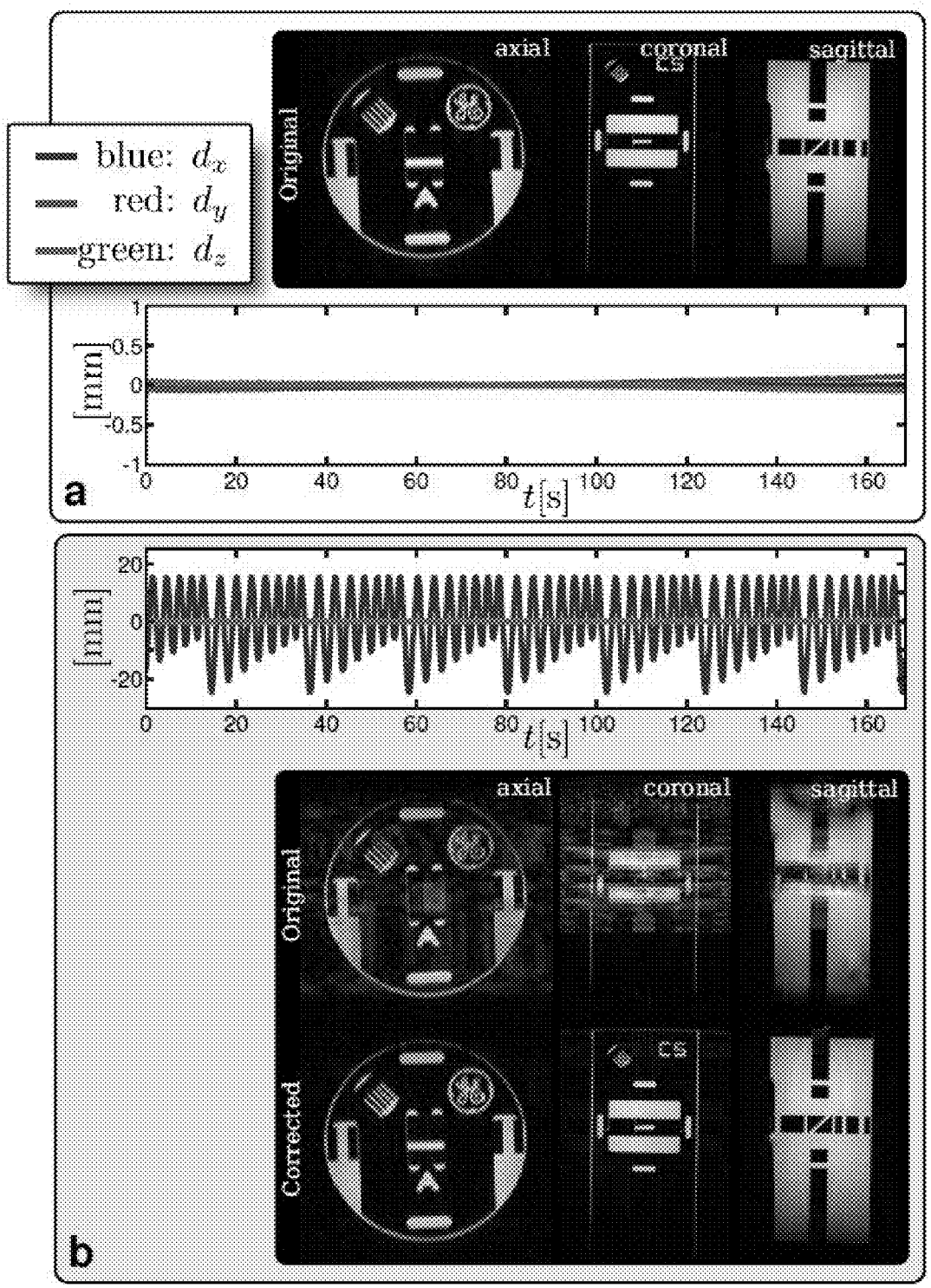
FIG. 6a illustrates a motionless scan with verified the stability of the motion measurements.
FIG. 6b illustrates a rigid body translation to validate the accuracy of the measurements and correction.

The Butterfly motion measurement procedure was first validated on a rigid phantom to determine our confidence in the measurements for patient scans. The stability of the measurements was verified using a motionless phantom, as shown in FIG. 6a. FIG. 6a illustrates a motionless scan with verified the stability of the motion measurements. FIG. 6b illustrates a rigid body translation to validate the accuracy of the measurements and correction. For FIG. 6a,b, $d_x$=superior/inferior motion, $d_y$=right/left motion, and $d_z$=anterior/posterior motion. In FIG. 6a, a drift of <0.25 mm was observed for a span of 170 s; this is negligible compared to actual motion, and could be corrected by polynomial fitting. In FIG. 6b, the motion was accurately measured as shown in the plot. This measurement successfully corrected for significant motion. Some residual ghosting artifacts remained due to gradient nonlinearity.

Sub-millimeter fluctuations and drift was observed in the motion path plot. The amplitude of these effects was extremely small—much smaller than conventional scan resolution. The quality of the measurements was verified using a phantom with translational rigid motion, as shown in FIG. 6b. With a simple linear correction, the motion artifacts were significantly reduced. Due to gradient nonlinearity and possibly off-resonance effects, some residual artifacts remained. Regardless, image quality was significantly improved and the accuracy of the motion measurement procedure was verified.

Figure 7:
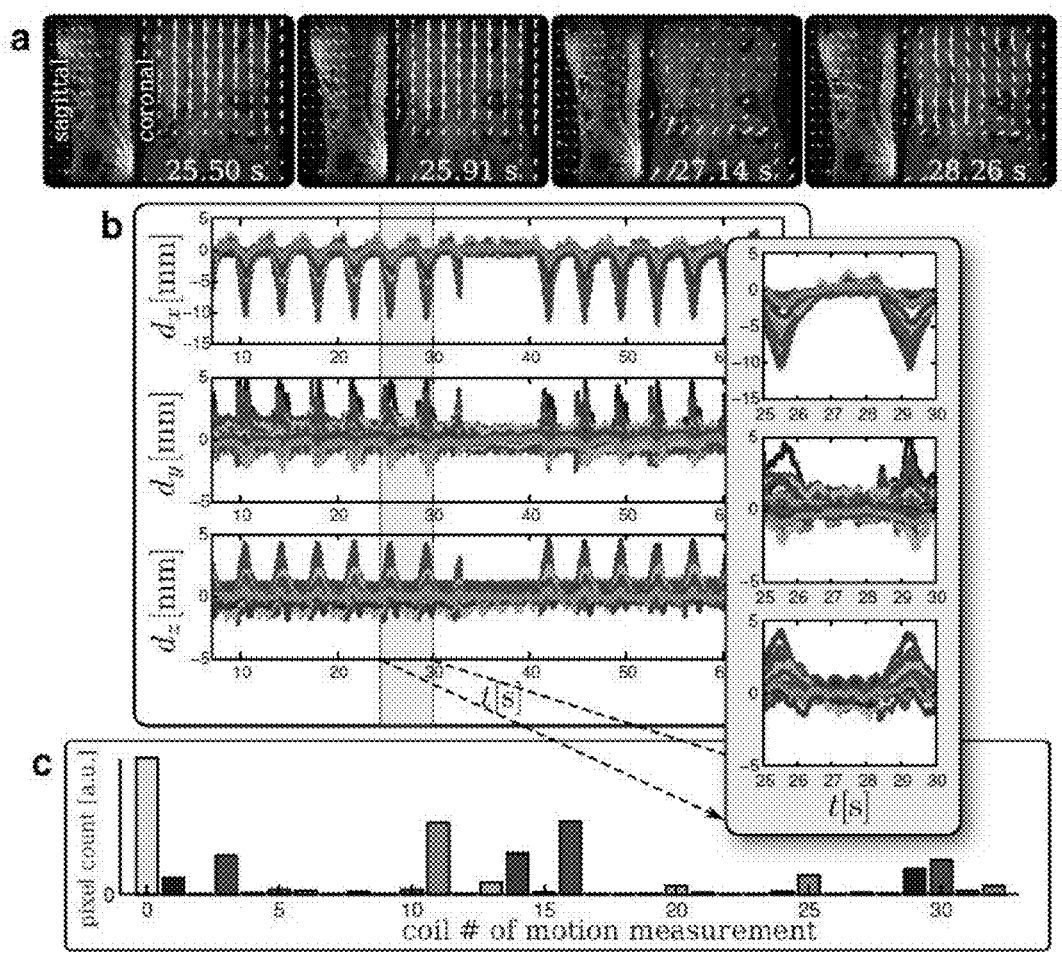
FIGS. 7a-c shows the results of a free-breathing three-dimensional abdominal study.

A free-breathing three-dimensional abdominal study was analyzed, and the results are shown in FIG. 7a-c. FIG. 7a shows resulting translation maps displayed in the sagittal (at −77.6 mm from isocenter) and coronal (at 5.8 mm from isocenter) slices at select time points accurately depicting the respiratory motion. FIG. 7b shows motion measurements acquired, where each shade is a motion estimate from a different coil. FIG. 7c is a histogram plot of number of pixels that was focused by each motion path, where the number of pixels gives an idea of the scan volume that was focused by each measurement. In FIG. 7c, the motion measurement number corresponds to the coil that observed that motion. Measurement number 0 corresponds to the case of no motion. FIG. 7a,b accurately depict the respiratory motion. Stationary regions in the lower torso were recognized by the algorithm. As expected, each coil observed a different degree of movement. The structure of the estimated paths agreed with what was expected: motion was dominated by periodic respiratory motion and a portion of the path was motionless from respiratory gating. Because the center of k-space was gated and relatively motion free, a majority of the motion artifacts were from corrupted data corresponding to higher spatial-frequencies. This resulted in image blurring as seen in the original three-dimensional volume in FIG. 8.

Derived translation maps in the sagittal and coronal orientation are shown in FIG. 7a for select time points. These maps agreed with normal respiratory motion. Bulk motion was noticed going from the inferior to superior direction during inspiration. There was a period of little to no motion, followed by bulk motion from the superior to inferior direction during expiration. Additionally, negligible motion was observed in the lower pelvis area where the patient was relatively motionless. In regions of low SNR and regions with little structure, a small degree of motion was mistakenly predicted by the algorithm. Fortunately, these areas were usually areas of little diagnostic value. As we will discuss later, these problems can be mitigated and potentially avoided.

Figure 8:
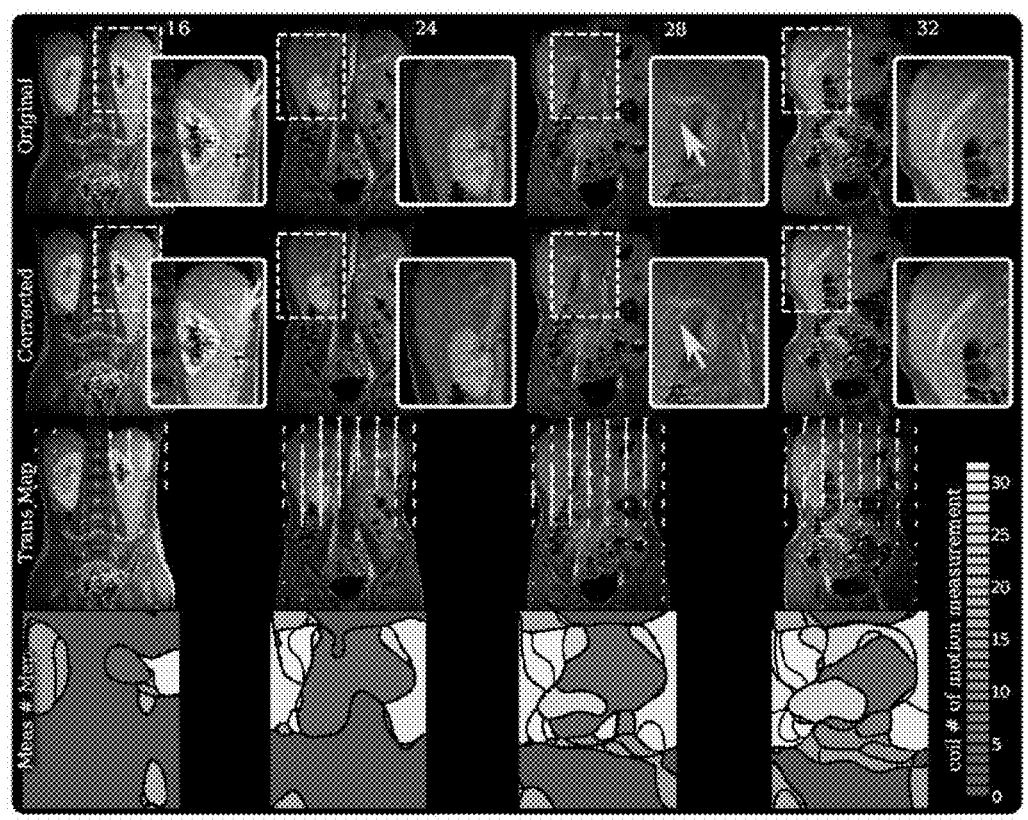
FIG. 8 shows results of an abdominal study performed on a 6-year-old patient using a three-dimensional SPGR sequence.

After performing the correction scheme on this first study, noticeable improvements were observed. In FIG. 8, this embodiment recovered some of the resolution that was lost from motion corruption. An increase in sharpness and structure was observed along the tissue planes and blood vessels. Some residual artifacts remained, as shown in slice 16. The uncorrected artifacts maybe because the motion measurements were unable to capture the exact motion path at these locations. Expanding the motion measurements to a larger search space should improve the correction quality.

FIG. 8 illustrates the results of an abdominal study performed on a 6-year-old patient using a three-dimensional SPGR sequence. The first row shows slices 16, 24, 28, and 32 of the original uncorrected three-dimensional volume. The second row shows the same slices from the corrected volume. The third row shows derived translation maps in the coronal plane. The fourth row shows maps of the motion measurement number used to correct each pixel. Measurement number maps demonstrate that the motion measured from one coil can extend beyond where that coil is most sensitive. Additionally, correcting with the nearest and most sensitive coil does not always yield optimal results. Ghosting artifacts were suppressed in slice 16. An increase in sharpness and structure can be seen in the liver vessels in slice 28.

VDRad was used to acquire the abdominal studies in FIGS. 9a-d and 10a-h. In these studies, the entire scan was acquired continuously while the patient was freely-breathing. FIG. 9a-d compares different image reconstructions with 11-slice maximum-intensity-projection of a 6-year-old male. FIG. 9a shows the result from conventional paralleling imaging and compressed sensing solved used L1-ESPIRiT. FIG. 9b shows the result from using soft-gated reconstruction solved using L1-wESPIRiT. FIG. 9c show the results from using the embodied autofocusing (AF) with conventional L1-ESPIRiT. Lastly, FIG. 9d shows the result of performing both soft-gating along with autofocusing. By applying either the soft-gated reconstruction or AF, the peripheral hepatic vessels are recovered (arrows). More detail and finer structures are enhanced through combining AF with the soft-gated reconstruction.

Figure 10:
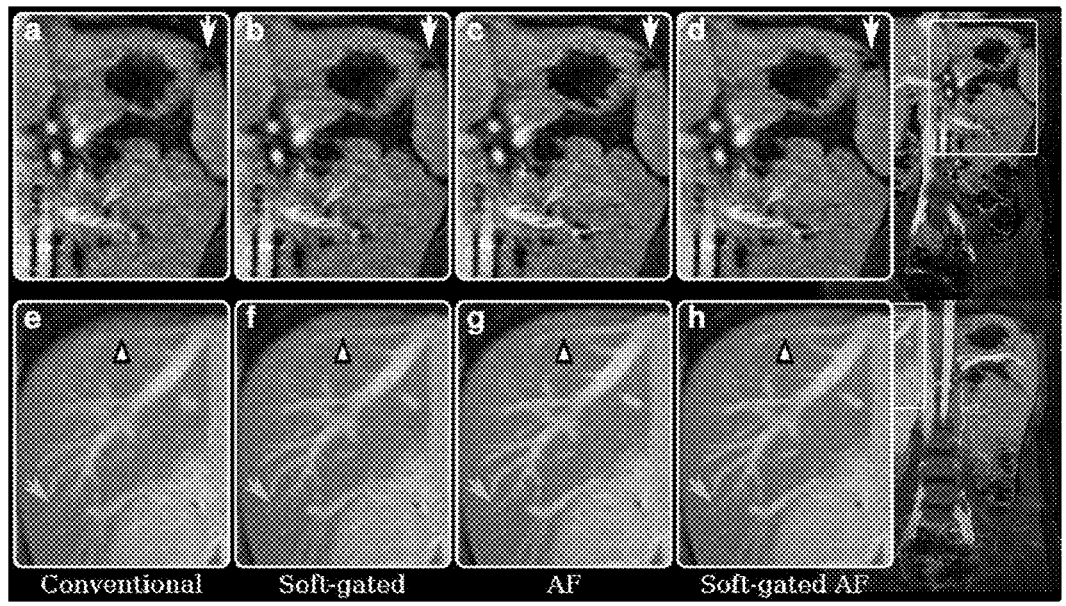
FIG. 10a-h shows results of a free-breathing abdominal study of a 4-year-old patient scanned post-contrast injection using VDRad.

FIG. 10 shows the results from a free-breathing volumetric scan of a 4-year-old female acquired post-contrast. FIG. 10a,e show the result from conventional L1-ESPIRiT. FIG. 10b,f show the results from the soft-gated reconstruction. FIG. 10c,g shows the result from autofocusing (AF) with conventional L1-ESPIRiT. FIG. 10d,h shows the result from the soft-gated AF. In the single slice images in FIG. 10a-d, the depiction of vessels to the bowels is improved (shaded dashes arrow), and the left hemi-diaphragm is sharpened (white arrow). Both AF and soft-gated AF reduce the apparent noise. Comparing the maximum-intensity-projection reconstructions of 11 slices in FIG. 10e-h, the fine hepatic vessels are recovered and sharpened (outlined triangle, shaded arrow). Soft-gated AF results in the sharpest vessels.

By applying either the soft-gated reconstruction or autofocusing with L1-ESPIRiT, recovery of vessels can be appreciated (FIGS. 9b,c and 10f,g). Finer vessel structures can be observed when the soft-gated reconstruction is combined with the autofocusing technique. Nonrigid motion correction using autofocusing alone can drastically improve the image quality. Soft-gated accelerated imaging is a simple addition, and it makes the autofocusing much more robust and allows for the recovery of finer features (FIGS. 9d and 10).

Robustness of the VDRad approach can be seen in the conventional L1-ESPIRiT reconstructions for the pediatric patient scans (FIGS. 9 and 10). Motion corruption does not induce harmful ghosting artifacts; destructive motion effects are localized as blurring and/or signal loss. Additive noise can also be observed. Generally, anatomical structures are intact and can still be visualized. If the motion is minimal, VDRad is sufficient in producing high quality results.

Motion Metric

The detail and accuracy of the correction depend strongly on how finely the motion artifact metric can be calculated. However, if $b_c$ is decreased to calculate the localized gradient entropy (Eq. [11]) for a very small region, noise or motion artifacts may potentially be amplified. The algorithm needs some edge information for better performance. There are a number of ways to ensure enough detail in the metric without compromising effectiveness.

One method is to use a small $b_c$ (<5 cm) and a criterion to ensure a smooth translation map. For this formulation, Eq. [14a] can be re-written as $$m_{ijk} = \arg\min_m \{H_{ijk}[m] + \lambda\|d_{m_{i+1,j,k}}[n_0] - d_m[n_0]\|^2 + \lambda\|d_{m_{i,j+1,k}}[n_0] - d_m[n_0]\|^2 + \lambda\|d_{m_{i,j,k+1}}[n_0] - d_m[n_0]\|^2\}$$ [19]

The acquisition number $n_0$ can be selected for the point in the path with the largest amount of motion. Variable $\lambda$ can be adjusted until the desired results are achieved.

Another way to adjust the motion metric is to expand the localized motion metric. Instead of just calculating the localized gradient entropy for one value of $b_c$, two values of $b_c$ can be used: a smaller one to differentiate high detail motion and a larger one to ensure some consistency in neighboring regions. The following formulation can be used as the motion metric $H_{ijk}$ in Eq. [14a].

$$H_{ijk} = H_{ijk}^l + \alpha H_{ijk}^h$$ [20]

Entropy $H_{ijk}^l$ is calculated using Eq. [11] with a large value of $b_c$, and $H_{ijk}^h$ is calculated with a small value of $b_c$. Scalar $\alpha$ is used to adjust the emphasis on translation map detail or to ensure that some edge information is captured. Example parameters used are $b_c=12$ cm for $H_{ijk}^l$, $b_c=2$ cm for $H_{ijk}^h$ and $\alpha=0.25$.

Motion Measurement

The autofocusing performance also depends on the motion measurements for an appropriate search space. By including a null motion path $d_0[n]=0$, we allow the algorithm to avoid any corrections if no sufficiently-accurate path exists.

Not all of the M measured motion paths were used in the correction, as shown in FIG. 7c. For the unused paths, we may have measured an area with no motion, repeated a measurement of another coil, or used a malfunctioning coil. In any case, this observation hints at the possibility to reduce the search space by discarding extraneous measurements. Also, the M measurements can be expanded to create a larger search space for autofocusing and to allow for a more accurate correction. This space can be further explored by using various linear coil-combinations for more localized sensitivities or by using filtering to reduce the FOV of each coil. By applying these operations to the navigator data, additional motion measurements can potentially be extracted. Reducing or extending this search space may be provided in other embodiments.

The motion measurements are used to perform localized corrections. If neighboring regions select extremely different motion paths for correction, unnatural discontinuities may arise. By requiring some spatial consistency in the autofocusing formation (Eqs. [19] and [20]), the problem can be mitigated. However, discontinuities may still arise if there are insufficient and/or inconsistent motion measurements. In our experience, measurements using a 32-channel pediatric coil array sufficiently covered the search space.

More coils with more localized sensitivities can help with the accuracy of the motion estimation. More elements to depict the local motion paths, such as rotational movement, can be measured and added to the correction model. The autofocusing scheme can determine the best local correction. A practical framework was provided that was able to show improvement by finding the optimal linear corrections in the given set. The motion model and correction algorithm can easily be extended to include more complex features. However, the amount of additional computation required should be considered.

Butterfly Navigator Data Acquisition

The autofocusing technique is independent of the motion measurement procedure. In this embodiment, the multiple measurements were made possible using the Butterfly trajectory. As mentioned, a concern when using the Butterfly trajectory is its sensitivity to system errors. These errors must be properly dealt with to accurately estimate the non-rigid motion as simple linear translations. The motion-extraction formulation in Eqs. [3], [4], [5], and [6] can be extended to include higher order errors. For example, if the system and/or application is prone to k-space drift $\Delta k[n] = (\Delta k_x[n], \Delta k_y[n], \Delta k_z[n])$, this term can be added to Eq. [5].

$$\min_{(c_r[n],\Delta k[n])} \Sigma_l w^2[l](c_r[n]|s_0(k[l]-\Delta k[n])|-|s_n[l]|)$$ [21]

The notation $s_0(k[l]-\Delta k[n])$ is the signal interpolated from k-space values of $k[l]$ to $(k[l]-\Delta k[n])$. This nonlinear optimization problem can be solved using a weighted Gauss-Newton algorithm. Afterward, the reference signal is updated to $s_0'[l] = c_r[n]s_0(k[l]-\Delta k[n])$ before Eq. [6] is computed. In this embodiment, accurate and stable measurements were obtained using the model in Eq. [2]. In experiments, 5 iterations of the Gauss-Newton algorithm on average are needed to estimate the linear translation fast enough for real-time applications.

Implementation

Correction schemes that take significantly longer than the full MR study are impractical to use for clinical applications. Therefore, significant effort was made to make the algorithm computationally efficient. With three-dimensional coil compression from M coils to $M_v$ virtual coils, the computation was reduced significantly.

Minimizing signal loss, the coil compression linearly combines data from the different coils. This process may amplify motion artifacts that can be reduced with a more sophisticated coil combination scheme. The correction can be further improved with more sophisticated steps in the proposed autofocusing scheme. For these extensions, a trade-off between computational cost and amount of improvement must be analyzed.

The bulk of the calculations was for computing each linear motion correction and for computing the resulting motion-artifact metric. These steps were implemented using C++/CUDA to take advantage of the parallel computing power of the graphics processing units. On the GeForce GTX 470 card, the linear motion correction for the k-space data of matrix size 320×256×52 took an average of 0.27 s for one motion path applied to one coil. The calculation of the localized gradient entropy for the same data size on the same processing unit took an average of 0.57 s. For this study, the total computation time was on the order of $(0.27M_v+0.57)$ (M+1) s. The additional +1 was for motion path $d_0[n]=0$. For M=32 and $M_v=6$, the computation time was 72.3 s. Additional computation time is needed for the other steps of the algorithm including memory transfer and coil combination. The total time was still less than 2 min.

Extension to Other Imaging Techniques

The autofocusing scheme is independent of the scan sequence. For practicality, only the local motion measurements are required. In most cases, the Butterfly trajectory can be used to obtain these measurements with a coil array. For scans that do not use pre-winder gradients, other techniques may be applied, such as acquiring the navigator data in an interleaved TR.

In another example, this embodiment is combined with the use of prospective motion compensation techniques. Overly-corrupt data can be re-acquired as in the diminishing variance algorithm. Or, the scan parameters can be adjusted to reflect the motion. With its high temporal-resolution, the Butterfly trajectory could be used to provide motion information in this context. These prospective methods have difficulty in compensating for non-rigid motion; thus, the use of the autofocusing method is still needed.

Other imaging techniques can be used in conjunction with our correction, but the post-processing for these methods may affect the computational complexity. Algorithms that preserve k-space phase, such as gridding for non-Cartesian imaging and field inhomogeneity correction, can be applied before or after coil compression. However, for algorithms that do not preserve k-space phase these steps must be applied for each motion measurement before the gradient entropy calculation. As long as the time needed to perform these steps is not significant, the scheme is still practical to apply.

If care is not taken, odd image artifacts can be introduced. An arbitrary TR reference $n_{ref}$ can be chosen to align each motion path $d_i[n]$. If the motion path candidates are not properly aligned, each candidate may correct the image to a different motion state. As a solution, we averaged and smoothed all estimates with a low-pass filter as $d_s[n]$. A histogram of $d_s[n]$ was constructed, and the largest histogram bin was determined. The TR with the value closest to the largest histogram bin was set as $n_{ref}$. Finally, each motion path was adjusted to $n_{ref}$.

The localized coil sensitivities provide for more sophisticated techniques. The measured motion path can be used to retrospectively reject overly-corrupt acquisitions; these acquisitions can be regenerated through any accelerated imaging technique. These techniques can also be used to shorten the overall scan duration thereby shortening the time duration the patient needs to remain stationary.

By approximating non-rigid motion with local linear translations, motion correction can be practically implemented. Through the use of the proposed localized gradient entropy criteria, the correction can be fine-tuned. The algorithm is made practical by reducing the data size using coil compression and by reducing the search space using motion measurements extracted from a coil array. Based on the motion criteria, the algorithm improves the quality of the final images. Results from abdominal studies confirm these improvements.

Butterfly Time Penalty Example

Figure 11:
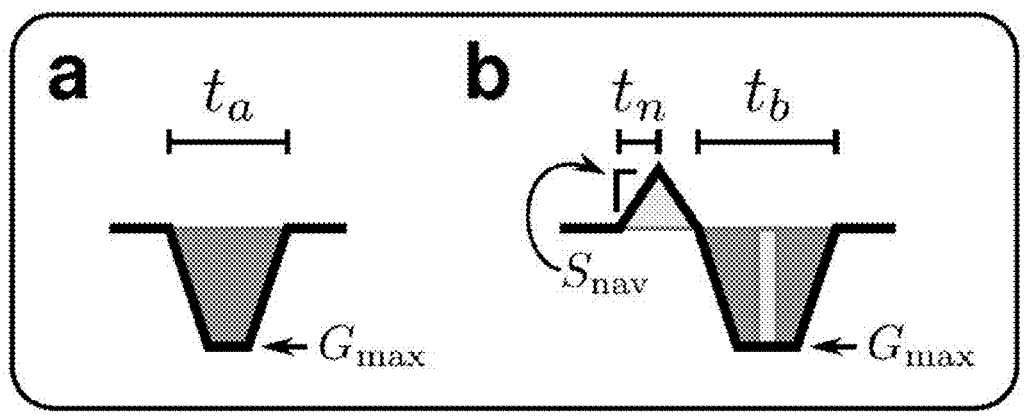
FIG. 11a shows the original phase-encode gradient that is constructed to be limited by the maximum gradient amplitude, $G_{max}$.
FIG. 11b shows the phase-encode gradient is modified to acquire the navigator data for a duration of $t_n$.

The Butterfly modification to the pre-winders allows navigator data to be acquired for every TR. Additionally, to increase robustness to systematic error, navigator data is acquired along each axis rather than along the k-space diagonals. A time penalty is required to implement this approach. We examined an example phase-encode gradient to determine the maximum amount of additional time is needed to implement the modified Butterfly technique. The original phase-encode gradient is constructed to be limited by the maximum gradient amplitude, $G_{max}$, as shown in FIG. 11a. Time $t_a$ is needed to complete the entire pre-winder. In FIG. 11b, the phase-encode gradient is modified to acquire the navigator data for a duration of $t_n$. The slew rate, $S_{nav}$, determines the extent of the navigator in k-space.

In the worst case, the Butterfly navigator is acquired in the opposite k-space direction of the phase-encoding. To compensate for the additional gradient area, the original phase-encode gradient is extended to a duration of $t_b$. For simplicity, it is assumed that the same slew rate is used to ramp down the Butterfly gradient blip. The time $t_n$ is related to $t_a$ and $t_b$ by examining the gradient areas, shown in FIG. 11b.

$$t_b = t_n^2 \frac{S_{nav}}{G_{max}} + t_a \qquad [22]$$

Since the navigator data is acquired along one gradient axis, an additional time $t_n$ is required. This allows the data to be collected before the other gradient axes are turned on. The total time needed for the modified phase-encode gradient is $$t_{total} = t_n + 2t_n + t_b \qquad [24]$$

$$= 3t_n + t_n^2 \frac{S_{nav}}{G_{max}} + t_a. \qquad [25]$$

The time difference $t_p$ between the original phase-encode gradient and the Butterfly modified phase-encode gradient is $$t_p = 3t_n + t_n^2 \frac{S_{nav}}{G_{max}}. \qquad [26]$$

In situations where no phase-encode reaches the gradient limit of $G_{max}$, the maximum gradient amplitude of the phase-encodes can be used in place of $G_{max}$ in Eq. [26]. The result will be an over-estimate, but it will give a good idea of the actual time penalty. For $t_n=0.14$ ms, $S_{nav}=200$ mT/m/ms, and $G_{max}=40$ mT/m, the additional time needed is $t_p=0.52$ ms. This time penalty can be reduced by shortening $t_n$ or relaxing $S_{nav}$. However, with these alterations, the motion information may be compromised.

Other Components

Figure 12:
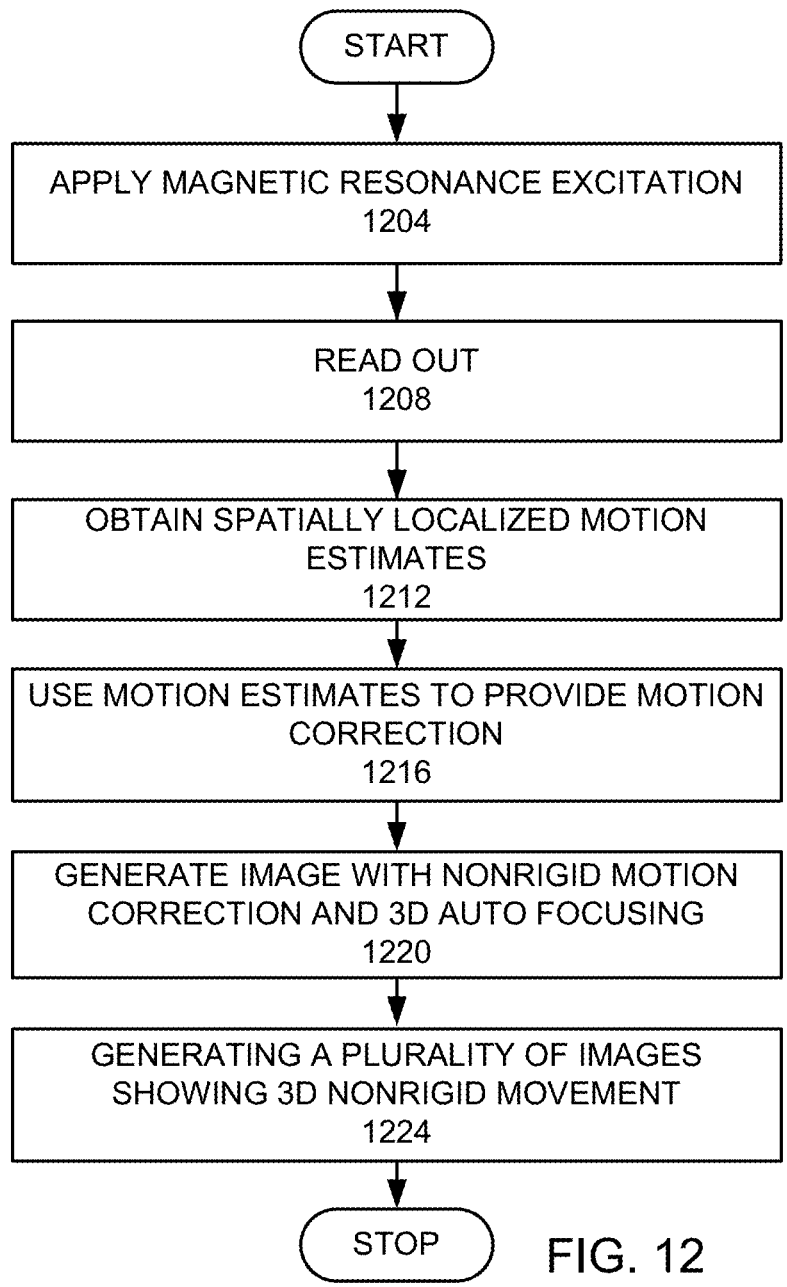
FIG. 12 is a flow chart of an embodiment of the invention.

To facilitate the understanding of the invention, FIG. 12 is a high level flow chart of an embodiment of the invention. An MRI excitation is applied to an object in a MRI system (step 1204). A readout is performed (step 1208). In this example, the readout uses an acquisition trajectory that has prewinders or rewinders. More specifically, an example uses a Butterfly trajectory for the acquisition trajectory. Spatially localized motion estimates are obtained (step 1212). The motion estimates are used to provide motion correction (step 1216). Nonrigid motion correction with 3D autofocusing are used to generate an image (step 1220). In addition, nonrigid motion correction and 3D autofocusing may be used to generate a plurality of images showing 3D nonrigid movement (step 1224).

Figure 13:
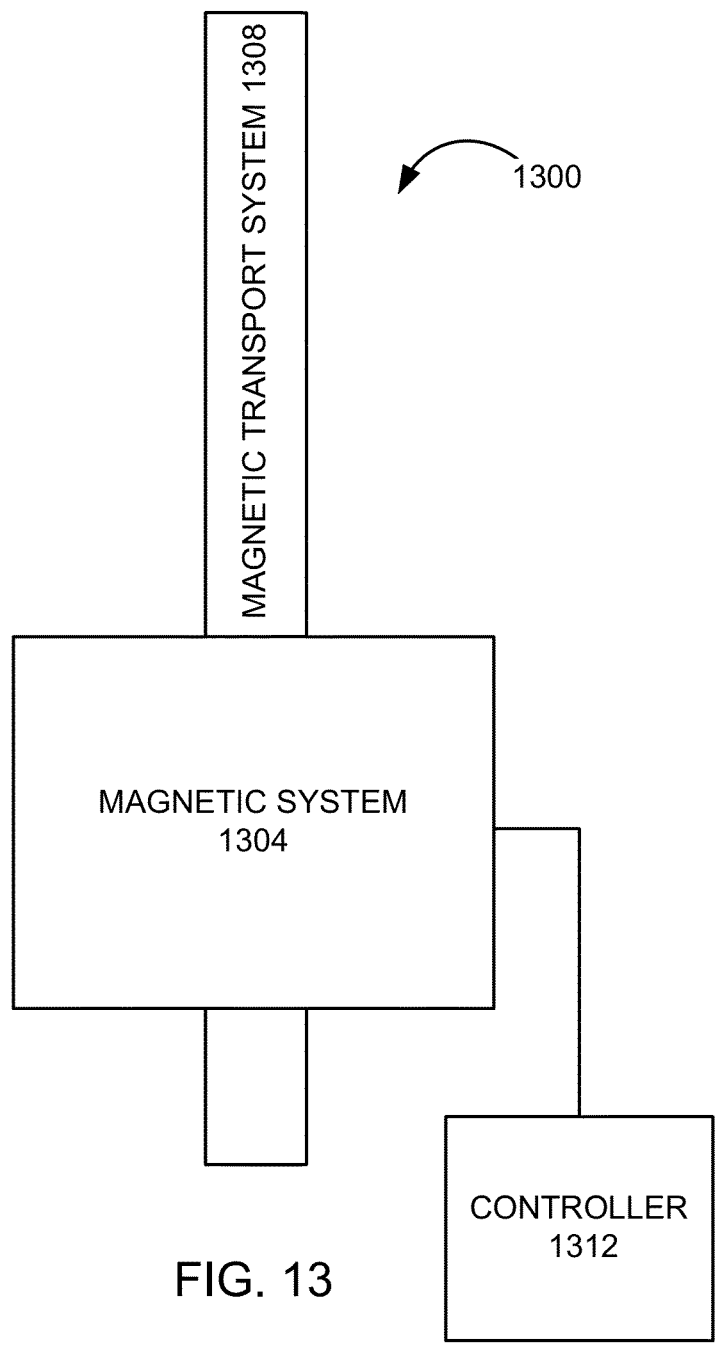
FIG. 13 is a schematic top view of a magnetic resonance imaging (MRI) system that may be used in an embodiment of the invention.

FIG. 13 is a schematic top view of a magnetic resonance imaging (MRI) system 1300 that may be used in an embodiment of the invention. The MRI system 1300 comprises a magnet system 1304, a patient transport table 1308 connected to the magnet system, and a controller 1312 controllably connected to the magnet system. In one example, a patient would lie on the patient transport table 1308 and the magnet system 1304 would pass around the patient. The controller 1312 would control magnetic fields and radio frequency (RF) signals provided by the magnet system 1304 and would receive signals from detectors in the magnet system 1304.

Figure 14:
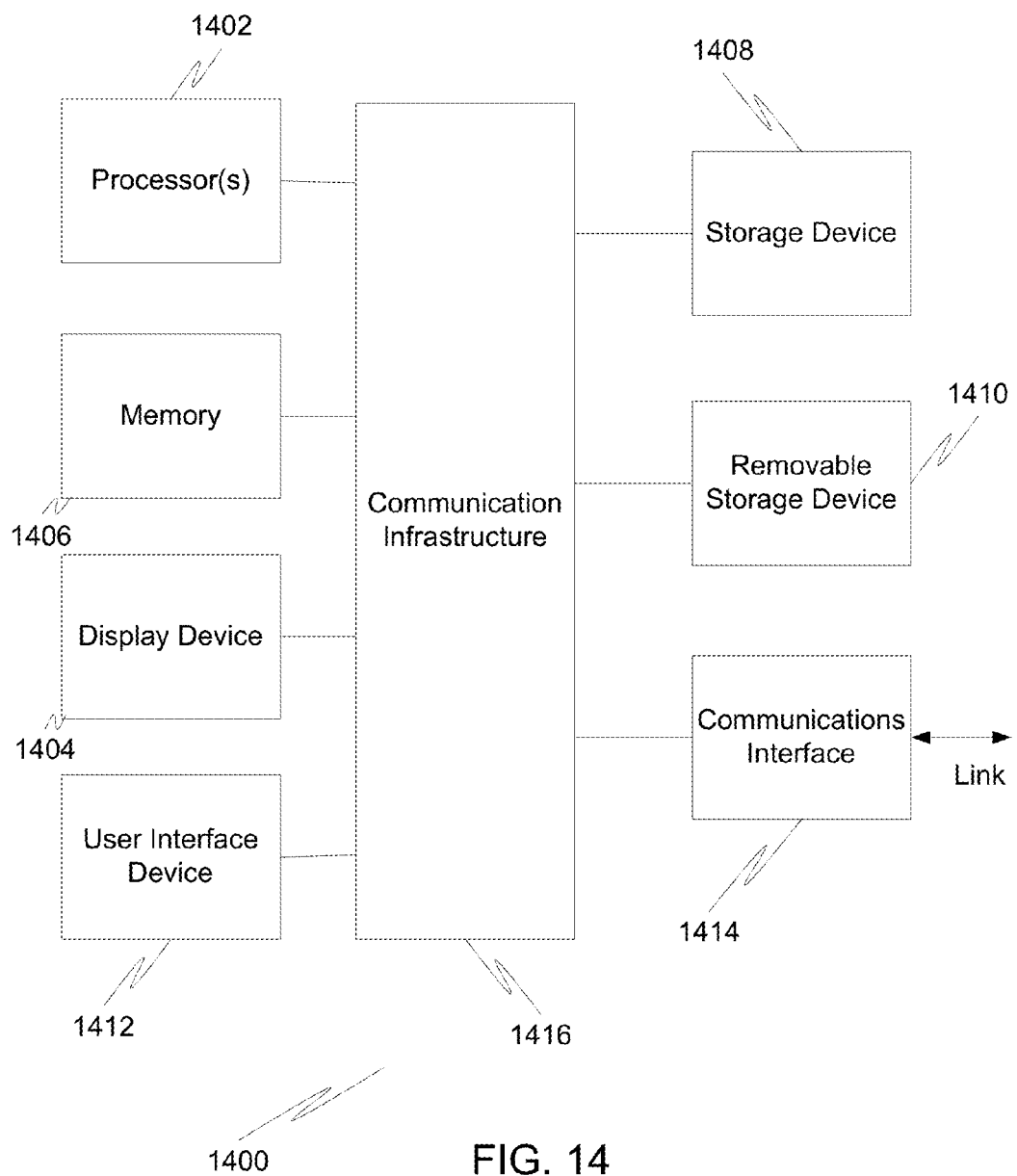
FIG. 14 illustrates a computer system that may be used in an embodiment of the invention.

FIG. 14 is a high level block diagram showing a computer system 1400, which may be used to provide the controller 1312. The computer system may have many physical forms ranging from an integrated circuit, a printed circuit board, and a small handheld device up to a computer. The computer system 1400 includes one or more processors 1402, and further can include an electronic display device 1404, a main memory 1406 (e.g., random access memory (RAM)), storage device 1408 (e.g., hard disk drive), removable storage device 1410 (e.g., optical disk drive), user interface devices 1412 (e.g., keyboards, touch screens, keypads, mice or other pointing devices, etc.), and a communication interface 1414 (e.g., wireless network interface). The communication interface 1414 allows software and data to be transferred between the computer system 1400 and external devices via a link. The system may also include a communications infrastructure 1416 (e.g., a communications bus, cross-over bar, or network) to which the aforementioned devices/modules are connected.

Information transferred via communications interface 1414 may be in the form of signals such as electronic, electromagnetic, optical, or other signals capable of being received by communications interface 1414, via a communication link that carries signals and may be implemented using wire or cable, fiber optics, a phone line, a cellular phone link, a radio frequency link, and/or other communication channels. With such a communications interface, it is contemplated that the one or more processors 1402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for providing a magnetic resonance imaging (MRI) with nonrigid motion correction of an object, comprising:
   applying an MRI excitation to the object;
   reading out magnetic field from the object using a plurality of sensor coils;
   obtaining spatially localized motion estimates for each sensor coil of the plurality of sensor coils;
   using the localized motion estimates as possible candidates to correct for local motions;
   determining a best motion estimate for correction at each spatial location based on an image-based motion metric; and
   generating an image with nonrigid motion correction from the determined best motion estimate for correction at each spatial location.

2. The method, as recited in claim 1, wherein the sensor coils are spaced apart so that different sensor coils sense different 3D motion to build a nonrigid motion model.

3. The method, as recited in claim 2, further comprising generating a plurality of images showing movement.

4. The method, as recited in claim 2, further comprising generating a plurality of images showing 3D nonrigid movement.

5. The method, as recited in claim 4, wherein the reading out the magnetic field uses an acquisition trajectory with navigators.

6. The method, as recited in claim 5, wherein the acquisition trajectory is a modified Butterfly trajectory.

7. The method, as recited in claim 6 wherein the modified Butterfly trajectory has navigators that acquire data along each axis.

8. The method, as recited in claim 7, wherein the obtaining spatially localized motion estimates, comprises weighting the read out magnetic field to avoid data corruption, such as from eddy currents and gradient hysteresis.

9. The method, as recited in claim 8, wherein the obtaining spatially localized motion estimates, further comprise performing coil compression.

10. The method, as recited in claim 1, further comprising generating a plurality of images showing movement.

11. The method, as recited in claim 1, further comprising generating a plurality of images showing 3D nonrigid movement.

12. The method, as recited in claim 1, wherein the reading out the magnetic field uses an acquisition trajectory with navigators.

13. The method, as recited in claim 7, wherein the obtaining spatially localized motion estimates, comprises weighting the read out magnetic field to avoid data corruption, such as from eddy currents and gradient hysteresis.

14. The method, as recited in claim 1, wherein the obtaining spatially localized motion estimates, further comprises combining data from a plurality of sensor coils into virtual coils.

15. The method, as recited in claim 1, further comprising a strategically planned data acquisition scheme to reduce the severity of image artifacts from motion corruption.

16. The method, as recited in claim 1, further comprising generating additional motion estimates based on a weighted summation of previously generated spatially localized motion estimates.

17. The method, as recited in claim 1, further comprising:
   generating a plurality of motion fields based on the spatially localized motion estimate; and
   using the motion fields to correct each spatial location to build a nonrigid motion model.

18. A method for providing an magnetic resonance imaging (MRI) with nonrigid motion correction of an object, comprising:
applying an MRI excitation to the object;
reading out magnetic field from the object using a plurality of sensor coils, wherein the sensor coils are spaced apart so that different sensor coils sense different 3D motion, wherein the reading out the magnetic field uses an acquisition trajectory with navigators;
obtaining spatially localized motion estimates for each sensor coil of the plurality of sensor coils;
using the motion estimates for each sensor coil to provide motion correction; and
using the localized motion estimates as possible candidates to correct for local motions;
determining a best motion estimate for correction at each spatial location based on a motion metric; and
generating an image with nonrigid motion correction from the determined best motion estimate for correction at each spatial location.

19. A method for providing a magnetic resonance imaging (MRI) with nonrigid motion correction of an object, comprising:
applying an MRI excitation to the object;
reading out magnetic field from the object using a plurality of sensor coils, wherein the reading out the magnetic field uses an acquisition trajectory with navigators, wherein the acquisition trajectory is a modified Butterfly trajectory;
obtaining spatially localized motion estimates for each sensor coil of the plurality of sensor coils; and
generating an image with nonrigid motion correction through localized 3D autofocusing, using the motion estimates for each sensor coil to provide nonrigid motion correction.

20. The method, as recited in claim 19 wherein the modified Butterfly trajectory has navigators that acquire data along each axis.

* * * * *